(12) United States Patent
Bernstein et al.

(10) Patent No.: US 8,421,126 B2
(45) Date of Patent: Apr. 16, 2013

(54) DOUBLE-SIDED INTEGRATED CIRCUIT CHIPS

(75) Inventors: Kerry Bernstein, Underhill, VT (US); Timothy Dalton, Ridgefield, CT (US); Jeffrey Peter Gambino, Westford, VT (US); Mark David Jaffe, Shelburne, VT (US); Paul David Kartschoke, Williston, VT (US); Stephen Ellinwood Luce, Underhill, VT (US); Anthony Kendall Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 13/164,173

(22) Filed: Jun. 20, 2011

(65) Prior Publication Data
US 2011/0241082 A1  Oct. 6, 2011

Related U.S. Application Data

(62) Division of application No. 12/612,957, filed on Nov. 5, 2009, now Pat. No. 7,989,312, which is a division of application No. 11/383,586, filed on May 16, 2006, now Pat. No. 7,670,927.

(51) Int. Cl.
*H01L 27/085* (2006.01)

(52) U.S. Cl.
USPC ...... 257/255; 257/74; 257/754; 257/E23.154; 257/E27.059

(58) Field of Classification Search .............. 257/74, 257/255, 754, E23.154, E27.059
See application file for complete search history.

(56) References Cited

U.S. PATENT DOCUMENTS

| | | | |
|---|---|---|---|
| 4,612,083 A | 9/1986 | Yasumoto et al. |
| 4,939,568 A | 7/1990 | Kato et al. |
| 5,825,696 A | 10/1998 | Hidaka et al. |
| 5,889,302 A | 3/1999 | Liu |
| 6,166,438 A | 12/2000 | Davidson |
| 6,355,501 B1 | 3/2002 | Fung et al. |
| 6,410,371 B1 | 6/2002 | Yu et al. |
| 6,573,172 B1 | 6/2003 | En et al. |
| 6,762,076 B2 | 7/2004 | Kim et al. |
| 6,812,127 B2 | 11/2004 | Oshima et al. |
| 6,815,278 B1 | 11/2004 | Ieong et al. |
| 6,821,826 B1 | 11/2004 | Chan et al. |

(Continued)

OTHER PUBLICATIONS

Notice of Allowance (Mail Date Oct. 8, 2009) for U.S. Appl. No. 11/383,586, filed May 16, 2006, First Named Inventor Kerry Bernstein.

(Continued)

*Primary Examiner* — Stephen W Smoot
*Assistant Examiner* — Vicki B Booker
(74) *Attorney, Agent, or Firm* — Schmeiser, Olsen & Watts; Richard Kotulak

(57) ABSTRACT

Semiconductor structures. The semiconductor structures include two silicon-on-insulator wafers having devices fabricated therein and bonding them back to back utilizing the buried oxide layers or bonding them back to back utilizing an inter-substrate dielectric layer and a bonding layer between the buried oxide layers. The structures include contacts formed in the upper wafer to devices in the lower wafer and wiring levels formed on the upper wafer. The lower wafer may include wiring levels. The lower wafer may include landing pads for the contacts. Contacts to the silicon layer of the lower wafer may be silicided.

23 Claims, 20 Drawing Sheets

U.S. PATENT DOCUMENTS

| | | | |
|---|---|---|---|
| 6,830,962 B1 | 12/2004 | Guarini et al. | |
| 6,943,067 B2 | 9/2005 | Greenlaw | |
| 7,312,487 B2 * | 12/2007 | Alam et al. | 257/278 |
| 7,320,115 B2 | 1/2008 | Kuo | |
| 7,670,927 B2 | 3/2010 | Bernstein et al. | |
| 7,989,312 B2 | 8/2011 | Bernstein et al. | |
| 8,013,342 B2 | 9/2011 | Bernstein et al. | |
| 2003/0129829 A1 | 7/2003 | Greenlaw | |
| 2004/0048459 A1 | 3/2004 | Patti | |
| 2004/0105300 A1 | 6/2004 | Chuang et al. | |
| 2004/0144979 A1 | 7/2004 | Bhattacharyya | |
| 2004/0188819 A1 | 9/2004 | Farnworth et al. | |
| 2005/0070077 A1 | 3/2005 | Guarini et al. | |
| 2005/0093104 A1 | 5/2005 | Ieong et al. | |
| 2005/0269680 A1 | 12/2005 | Hsuan | |
| 2005/0275017 A1 * | 12/2005 | Pozder et al. | 257/347 |
| 2006/0068557 A1 | 3/2006 | Ochimizu et al. | |
| 2006/0226491 A1 * | 10/2006 | Gauthier et al. | 257/369 |
| 2007/0267723 A1 | 11/2007 | Bernstein et al. | |
| 2009/0121260 A1 | 5/2009 | Bernstein et al. | |
| 2010/0044759 A1 | 2/2010 | Bernstein et al. | |
| 2011/0302542 A1 | 12/2011 | Bernstein et al. | |

OTHER PUBLICATIONS

Notice of Allowance (Mail Date Mar. 22, 2011) for U.S. Appl. No. 12/612,957, filed Nov. 5, 2009, First Named Inventor Kerry Bernstein.

Office Action (Mail Date Nov. 19, 2010) for U.S. Appl. No. 11/939,612, filed Nov. 14, 2007, First Named Inventor Kerry Bernstein.

Notice of Allowance (Mail Date May 3, 2011) for U.S. Appl. No. 11/939,612, filed Nov. 14, 2007, First Named Inventor Kerry Bernstein.

Office Action (Mail Date Jun. 4, 2012) for U.S. Appl. No. 13/192,608, filed Jul. 28, 2011.

U.S. Appl. No. 13/192,608, filed Jul. 28, 2011, First Name Inventor Kerry Bernstein.

* cited by examiner

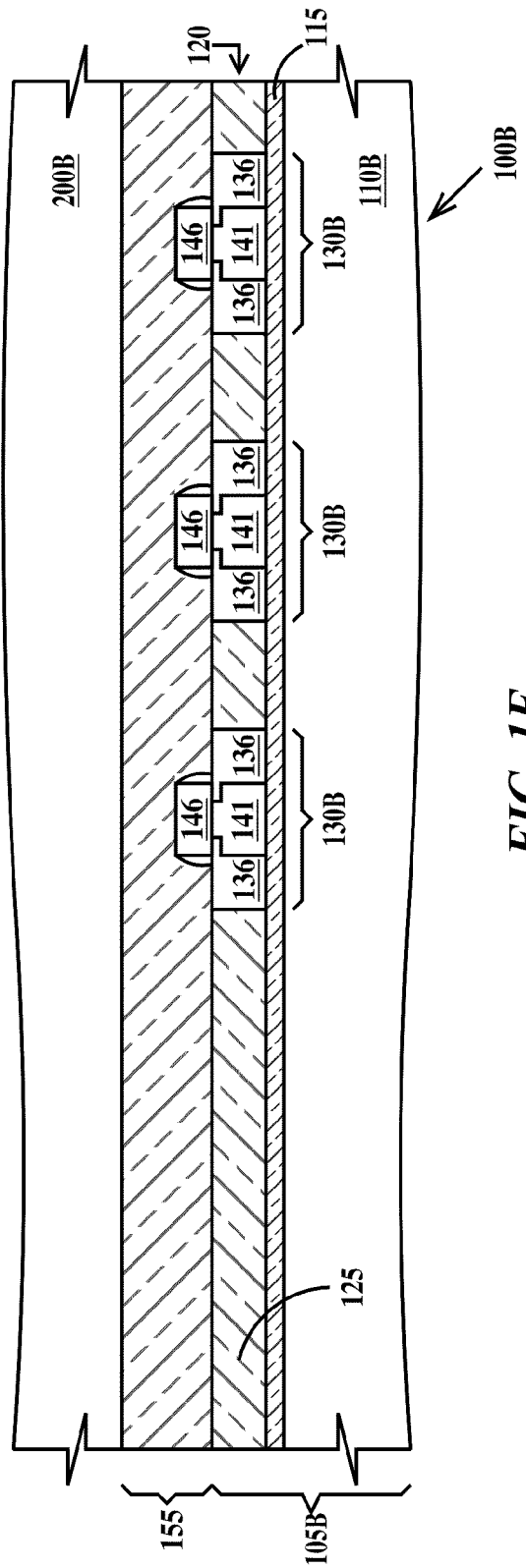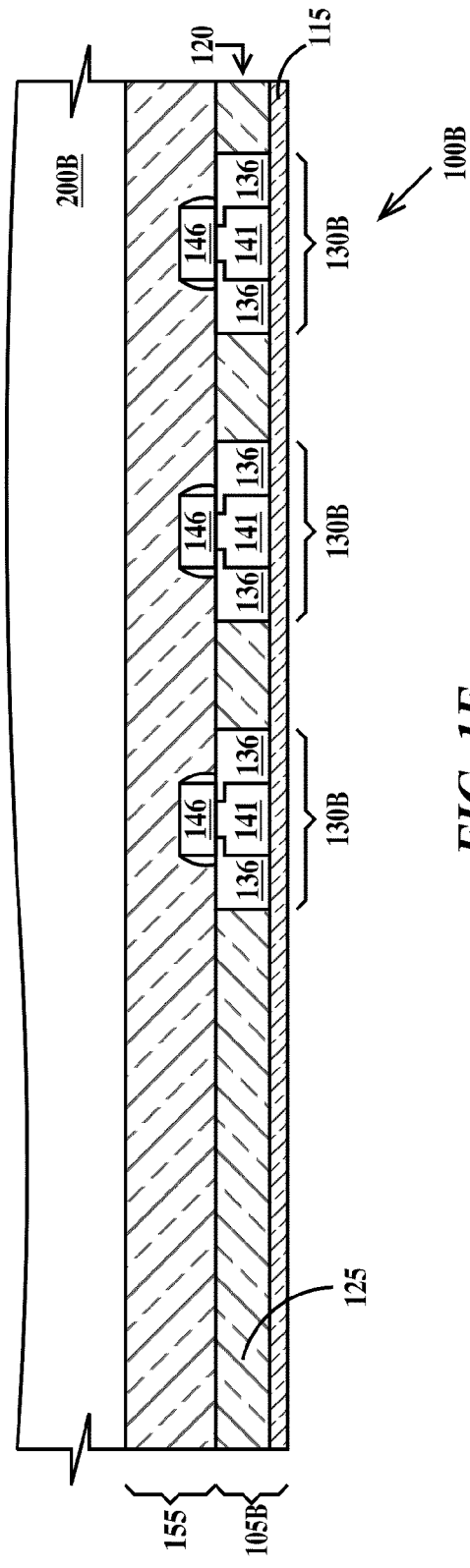

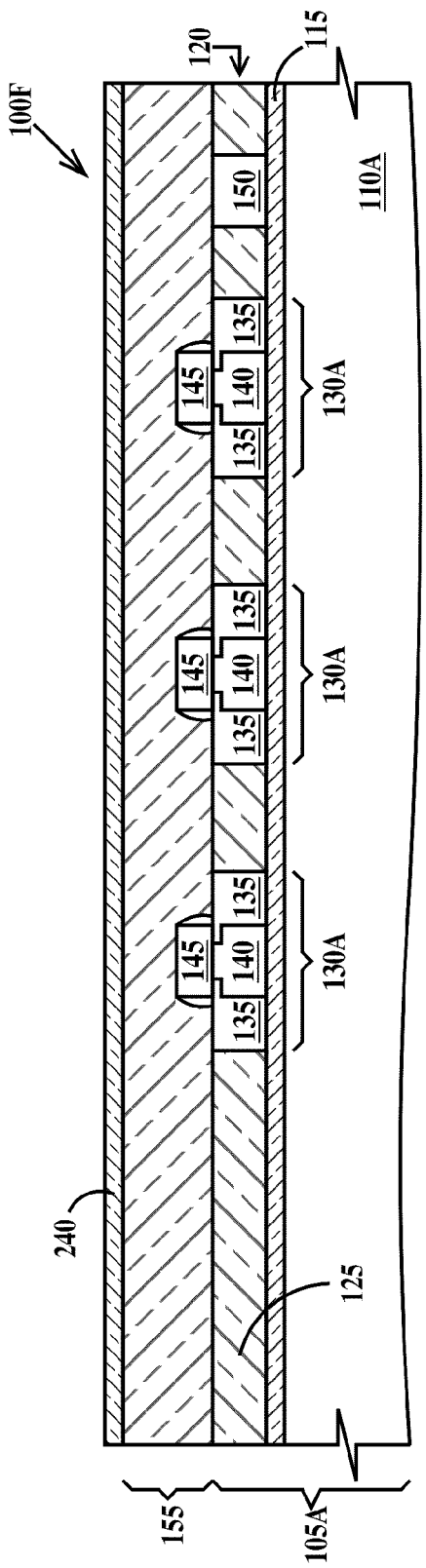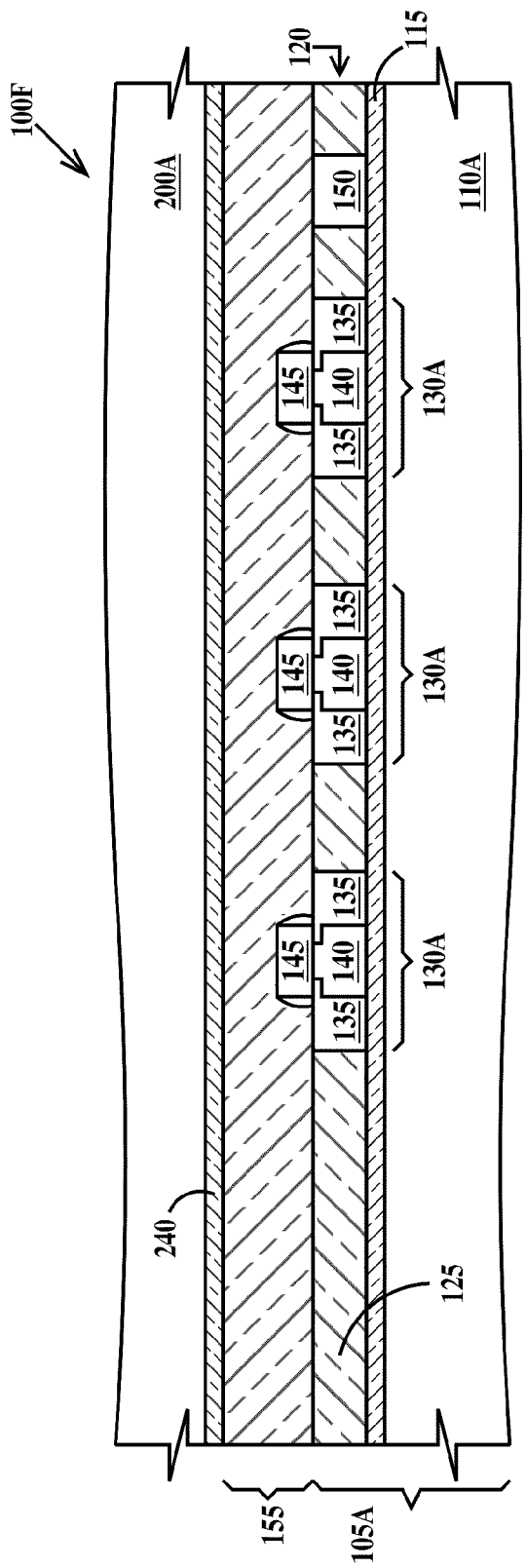
FIG. 4A
FIG. 4B

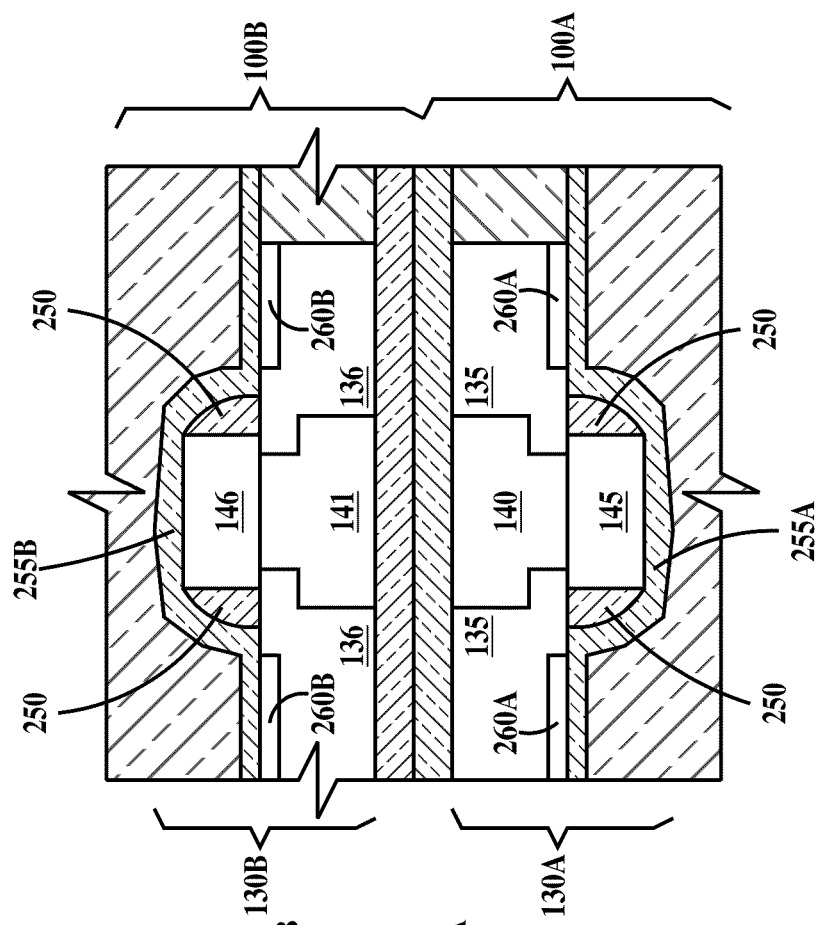
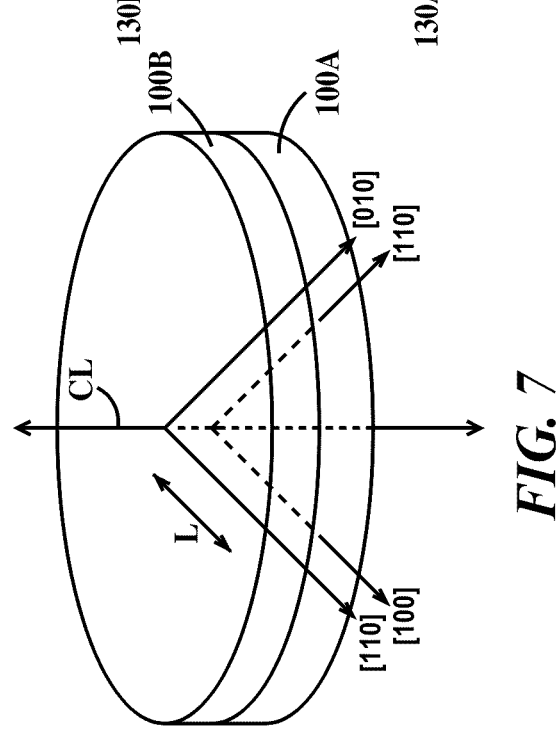
FIG. 8
FIG. 7

DOUBLE-SIDED INTEGRATED CIRCUIT CHIPS

This Application is a division of application Ser. No. 12/612,957 filed on Nov. 5, 2009, now U.S. Pat. No. 7,989,312, issued Aug. 2, 2011, which is a divisional of application Ser. No. 11/383,586 filed on May 16, 2006, U.S. Pat. No. 7,670,927, issued Mar. 2, 2010.

FIELD OF THE INVENTION

The present invention relates to the field of integrated circuits; more specifically, it relates to double-sided integrated circuit chips and methods of fabricating double sided integrated circuit chips.

BACKGROUND OF THE INVENTION

To maximize the performance of integrated circuits the fabrication process is adjusted to enhance the performance of different devices and circuits in different regions of the integrated circuit chip. This can be difficult and costly to accomplish when; for example, thermal cycles that are required by one set of devices can adversely affect other devices on the same integrated circuit chip. Further, it is often difficult to center the fabrication process tightly around the device specifications for different types of device simultaneously. Therefore, there is a need for integrated circuit chips and methods of fabricating integrated circuit chips wherein the fabrication process may be adjusted to enhance the performance of different types of devices in a cost effective manner.

SUMMARY OF THE INVENTION

A first aspect of the present invention is a method of fabricating a semiconductor structure, comprising: fabricating one or more first devices in a silicon-on-insulator first wafer, the first wafer comprising a first buried oxide layer between a first upper silicon layer and a first lower silicon layer and a first lowermost dielectric layer on the first upper silicon layer; fabricating one or more second devices in a silicon-on-insulator second wafer, the second wafer comprising a second buried oxide layer between a second upper silicon layer and a second lower silicon layer and a second lowermost dielectric layer on the second upper silicon layer; removing the first lower silicon layer from the first wafer to expose a surface of the first buried oxide layer and removing the second lower silicon layer from the second wafer to expose a surface of the second buried oxide layer; bonding the surface of the first buried oxide layer to the surface of the second buried oxide layer; forming electrically conductive first contacts to the second devices, the first contacts extending from a top surface of the second lowermost dielectric layer through the second lowermost dielectric layer to the first devices; forming electrically conductive second contacts to the first devices, the second contacts extending from the top surface of the second lowermost dielectric layer through the second lowermost dielectric layer, through the first and second buried oxide layers to those portions of the second devices formed in the second upper silicon layer; and forming one or more second wiring levels over the second lowermost dielectric layer, each wiring level of the second wiring levels comprising electrically conductive wires in a corresponding dielectric layer, one or more wires of a lowermost wiring level of the second wiring levels in physical and electrical contact with the first and second contacts.

A second aspect of the present invention is a the first aspect further including: interconnecting the first devices with one or more first wiring levels formed over the first upper silicon layer, each wiring level of the first wiring levels comprising electrically conductive wires in a corresponding dielectric layer, the one or more first wiring levels including electrically conductive wires formed in the first lowermost dielectric layer.

A third aspect of the present invention is a the second aspect further including: forming electrically conductive third contacts to one or more of the wires in the first lowermost dielectric layer, the third contacts extending from the top surface of the second lowermost dielectric layer through the second lowermost dielectric layer, through the first and second buried oxide layers and through the first upper silicon layer to one or more wires of the wires in the first lowermost dielectric layer, the third contacts electrically isolated from the first upper silicon layer.

A fourth aspect of the present invention is a the first aspect, further including: before the removing the first lower silicon layer, attaching a first handle wafer to an uppermost dielectric layer of the first wafer furthest away from the first upper silicon layer; before the removing the second lower silicon layer, attaching a second handle wafer to the first lowermost dielectric layer; and after the bonding, removing the second handle wafer.

A fifth aspect of the present invention is the first aspect, further including: after the removing the first and second lower silicon layers and before the bonding, aligning the first wafer to the second wafer.

A sixth aspect of the present invention is the first aspect further including: dicing the bonded first and second wafers into one or more integrated circuit chips.

A seventh aspect of the present invention is the first aspect, wherein the first devices are N-channel field effect transistors and the second devices are P-channel field effect transistors.

An eighth aspect of the present invention is a the first aspect, wherein the first upper silicon layer is a single crystal silicon layer having a <100> crystal orientation, the first devices are N-channel field effect transistors and the channel length of the N-channel field effect transistors is along the [100] crystal direction of the first upper silicon layer and wherein the second upper silicon layer is a single crystal silicon layer having a <110> crystal orientation, the second devices are P-channel field effect transistors and the channel length of the P-channel field effect transistors is along the [110] crystal direction of the second upper silicon layer.

A ninth aspect of the present invention is a the first aspect, wherein the first devices are N-channel field effect transistors, sources and drains thereof are in tension and the second devices are P-channel field effect transistors sources and drains thereof are in compression.

A tenth aspect of the present invention is a the first aspect, wherein the first and second devices are field effect transistors, the first devices having a higher threshold voltage than the second devices or wherein the first and second devices are field effect transistors, the first devices having a thicker gate dielectric than the second devices.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 1A through 1J are cross-sectional drawings illustrating fabrication of an integrated circuit chip according to a first embodiment of the present invention;

FIGS. 4A through 4E are cross-sectional drawings illustrating fabrication of an integrated circuit chip according to a second embodiment of the present invention;

FIG. 7 is an isometric view of an optional alignment of two wafers during fabrication of integrated circuit chips according to the embodiments of the present invention;

FIG. 8 is a cross-sectional view of optional fabrication steps during fabrication of integrated circuit chips according to the embodiments of the present invention.

DETAILED DESCRIPTION OF THE INVENTION

Figure 1A:
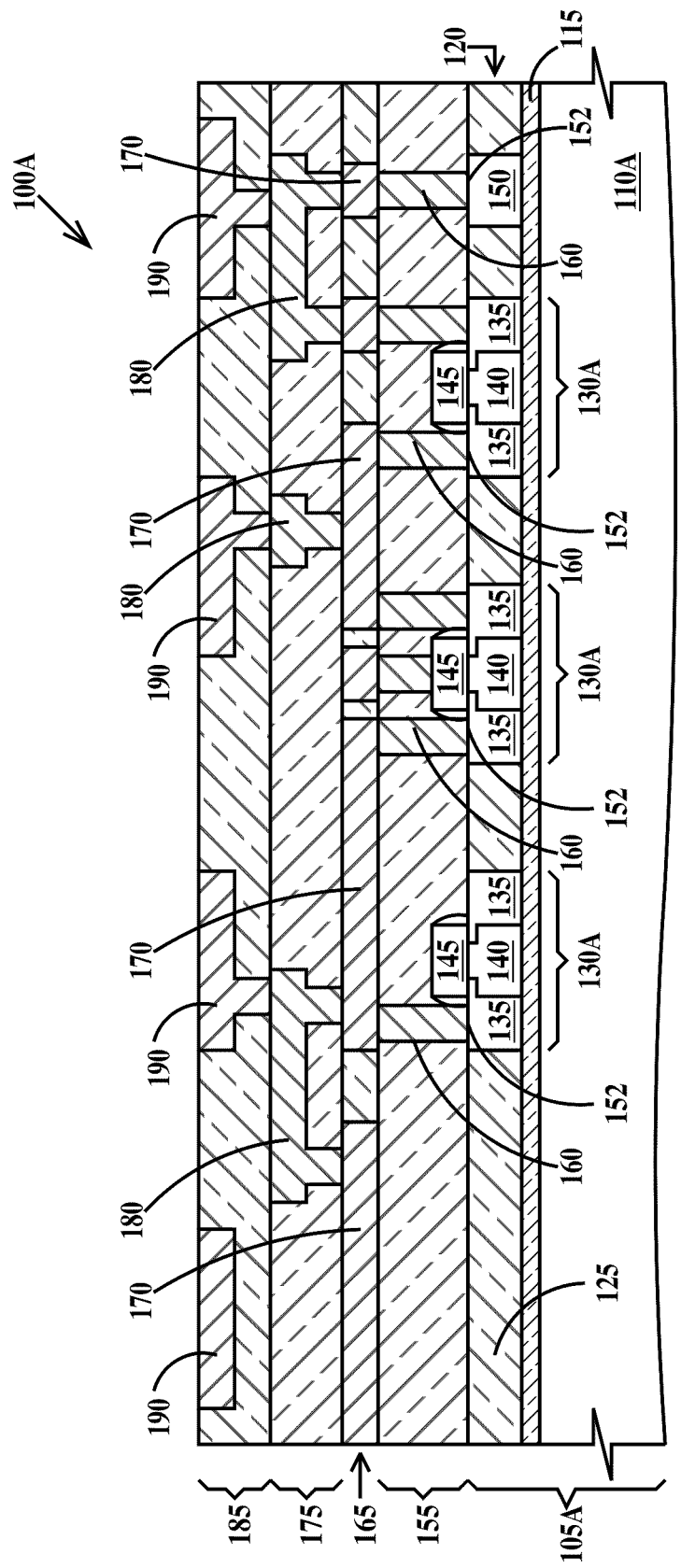

It should be understood that the integrated circuit chips of the embodiments of the present invention are advantageously formed on integrated circuit substrates called wafers and that multiple integrated circuits may be fabricated simultaneously on the same wafer and may be separated by a dicing process after fabrication is complete. Because the processes of present invention requires joining various wafers at various stages of fabrication to various wafers at various stages of fabrication and because the various wafers can be modified wafers before or after the joining by adding, removing or modifying elements of the wafers, the reference numerals initially used to designate any particular wafer or substrate portion of a wafer will be retained in subsequent drawing FIGs. where that wafer or a modified version of that wafer is involved. Because various wafers contain the same element (e.g., buried oxide layers, silicon layers, silicon regions, pre-metal dielectric layers, contacts, first, second, third interlevel dielectric layers, wires in the interlevel dielectric layers, I/O pads, and passivation layers) the reference numerals of these elements has been left the same in the various wafers. However, to avoid confusion, when this occurs the wafer containing the element is always explicitly stated if it not obvious from context.

FIGS. 1A through 1J are cross-sectional drawings illustrating fabrication of an integrated circuit chip according to a first embodiment of the present invention. In FIG. 1A, a first wafer 100A is fabricated through pad level. Wafer 100A includes a silicon-on-insulator (SOI) substrate 105A which includes a silicon substrate 110A, a buried oxide layer (BOX) 115 formed on the silicon substrate and a single-crystal silicon layer 120 formed on the BOX. Formed in silicon layer 120 is trench isolation 125 and source/drains 135 and channel regions 140 of field effect transistors (FETs) 130A. Also formed in silicon layer 120 are optional silicon regions 150. Formed over channel regions 140 are a gate dielectric (not shown) and, in one example, polysilicon gates 145 of FETs 130A. In one example, silicon regions 150 are highly doped N or P-type (between about 1E19 atm/cm$^3$ and about 1E21 atm/cm$^3$ in order to reduce the resistance of the contact to less than about 0.5 micro-ohms. An optional metal silicide layer 152 may be formed on exposed silicon surfaces of source/drains 135, gates 145 and diffusion contacts 150 prior to formation of a pre-metal dielectric (PMD) layer 155. Metal silicides are formed by deposition of a metal layer on a silicon surface, heating the silicon surface high enough to cause the metal layer to react with the silicon, and then dissolving away any unreacted metal. At this point, the high temperature anneals or rapid thermal anneals (RTAs) required to complete fabrication of FETs 130A are completed.

Formed on top of silicon layer 120 is PMD layer 155. Formed in PMD layer 155 are contacts 160. Contacts 160 are electrically conductive and electrically contact source/drains 135, gates 145 and silicon contact 150 or other active or passive elements on/in the silicon, such as bipolar junction transistors, thin film resistors, junction capacitors, gate polysilicon capacitors, and the like. PMD layer 155 and contacts 160 may be considered a pseudo wiring level, connecting the devices on the silicon to the first wiring level. In one example, contacts 160 are formed by a damascene process. Formed on PMD layer 155 is a first (inter-level dielectric) ILD 165 containing first wiring level conductive damascene wires 170 which may be in electrical contact with contacts 160. Formed on first ILD 165 is a second ILD 175 including electrically conductive dual-damascene wires 180 in electrical contact with wires 170. Formed on second ILD 175 is a third ILD 185 including electrically conductive dual-damascene I/O pads 190 in electrical contact with wires 180. Alternatively, wires 170, 180 and pads 190 may be single damascene wires or pads in combination with single damascene vias.

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

The etchs used in single-damascene and dual damascene processes to form trenches may advantageously be reactive ion etches (RIEs).

In one example, PMD layer 155 comprises boro-phospho-silicate glass (BPSG). In one example, contacts 160 comprise a bilayer of titanium/titanium nitride liner and a tungsten core. In one example, ILD 165, 175 and 185 comprise one or more of silicon dioxide or carbon-doped oxide optionally formed over a layer of silicon nitride, silicon carbo-nitride, or silicon carbo-oxynitride. In one example, wires 170 and 180 and 110 pads 190 comprise a tantalum/tantalum nitride liner and a copper core.

In one example, first ILD 165, second ILD 175 and third 185 independently comprise silicon dioxide ($SiO_2$), silicon nitride ($Si_3N_4$), silicon carbide (SiC), silicon oxy nitride (SiON), silicon oxy carbide (SiOC), organosilicate glass (Si-COH), plasma-enhanced silicon nitride ($PSiN_x$) or NBLok (SiC(N,H)).

In one example, first ILD 165, second ILD 175 and third ILD 185 independently comprise a low K (dielectric constant) material, examples of which include but are not limited to hydrogen silsesquioxane polymer (HSQ), methyl silsesquioxane polymer (MSQ), SILK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, Calif., organosilicate glass (SiCOH), and porous SiCOH. In one example, a low K dielectric material has a relative permittivity of about 2.4 or less.

Figure 1B:
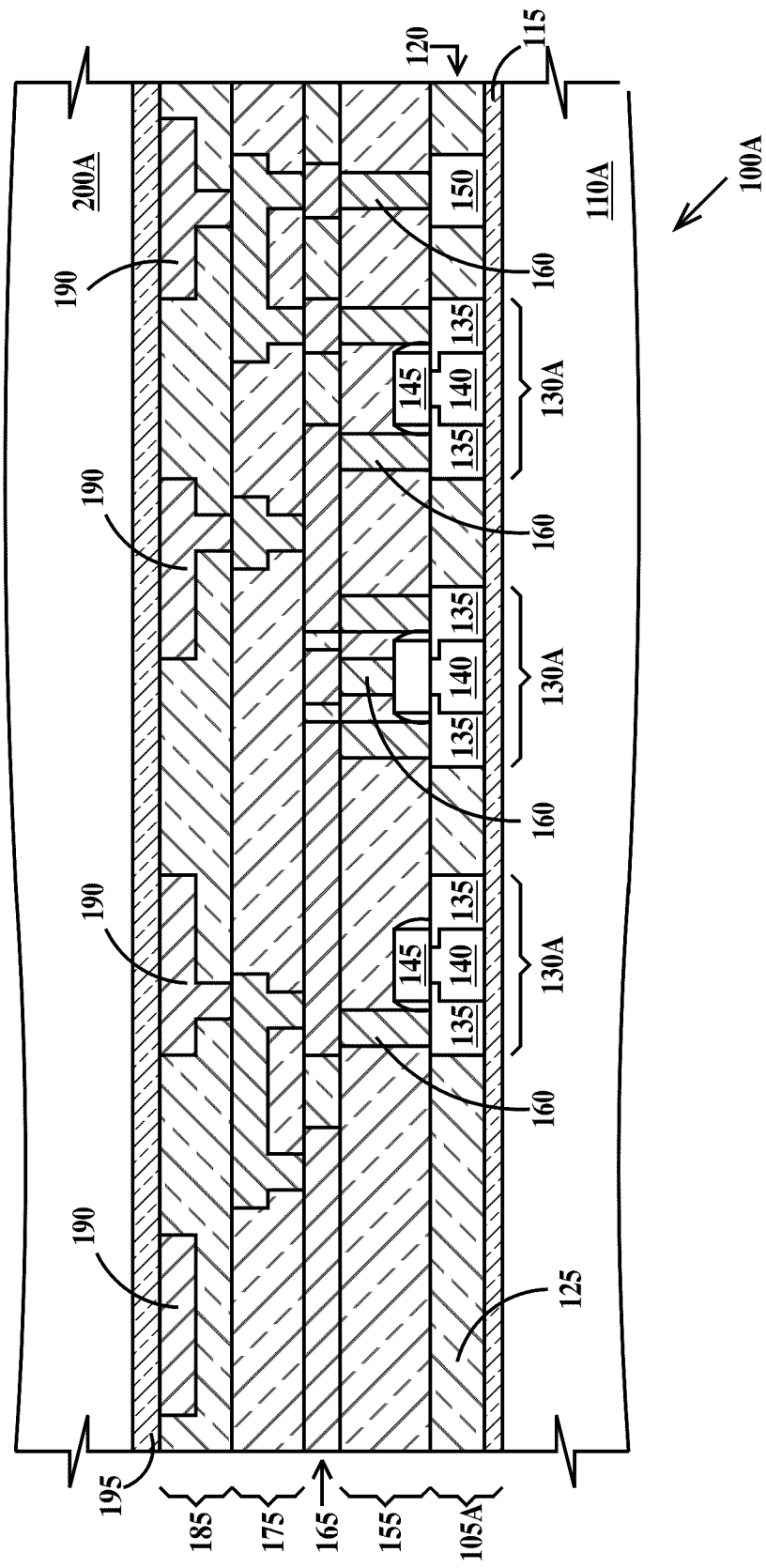

In FIG. 1B, a passivation layer 195 is formed on third ILD 185 and I/O pads 190 and a handle wafer 200A attached to passivation layer 195 using an adhesive (not shown) or by other methods known in the art. The handle wafer is thick enough (e.g. 200-1000 microns) to support the silicon wafer during subsequent processing.

Figure 1C:
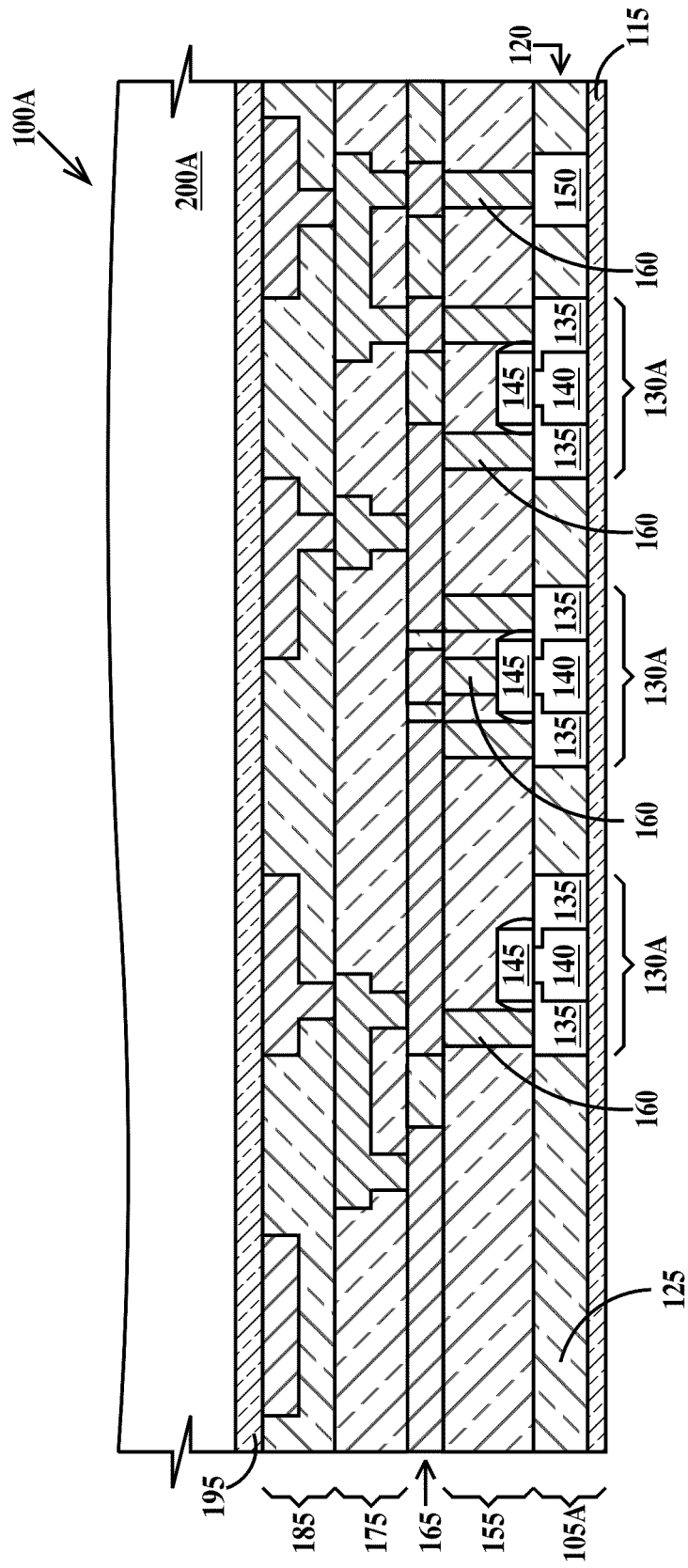

In FIG. 1C, bulk substrate 110A (see FIG. 1B) is removed to expose BOX 115. In one example, bulk substrate 110A is removed by a grinding operation to substantially thin of the bulk substrate operation followed by a chemical etch in a strong base such as aqueous potassium hydroxide to remove the remaining bulk substrate.

Figure 1D:
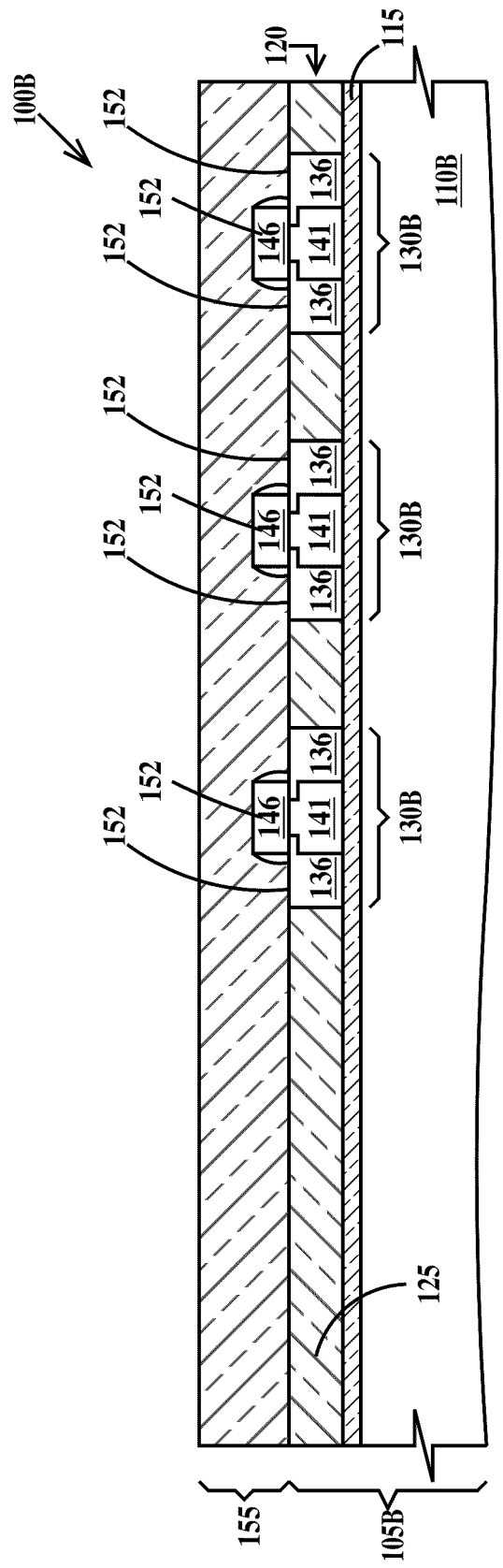

In FIG. 1D, a second wafer 100B is fabricated through PMD. Wafer 100B includes a silicon-on-insulator (SOI) substrate 105B which includes a silicon substrate 110B, a buried oxide layer (BOX) 115 formed on the silicon substrate and a single-crystal silicon layer 120 formed on the BOX. Formed in silicon layer 120 is trench isolation 125 and source/drains 136 and channel regions 141 of field effect transistors (FETs) 130B. Formed over channel regions 141 are a gate dielectric (not shown) and, in one example, polysilicon gates 146 of FETs 130B. Again, optional metal silicide layer 152) may be formed on exposed silicon surfaces of source/drains 136 and gates 146 prior to formation of pre-metal dielectric (PMD) layer 155. Formed on top of silicon layer 120 is PMD layer 155. At this point, the high temperature anneals required to complete fabrication of FETs 130B are completed.

In FIG. 1E, a handle wafer 200B attached to PMD layer 155 using an adhesive (not shown) or by other methods known in the art.

In FIG. 1F, bulk substrate 110B (see FIG. 1E) is removed to expose BOX 115. In one example, bulk substrate 110B is removed by a grinding process to substantially thin of the bulk substrate operation followed by a chemical etch is a strong base such as aqueous potassium hydroxide to remove the remaining bulk substrate.

Figure 1G:
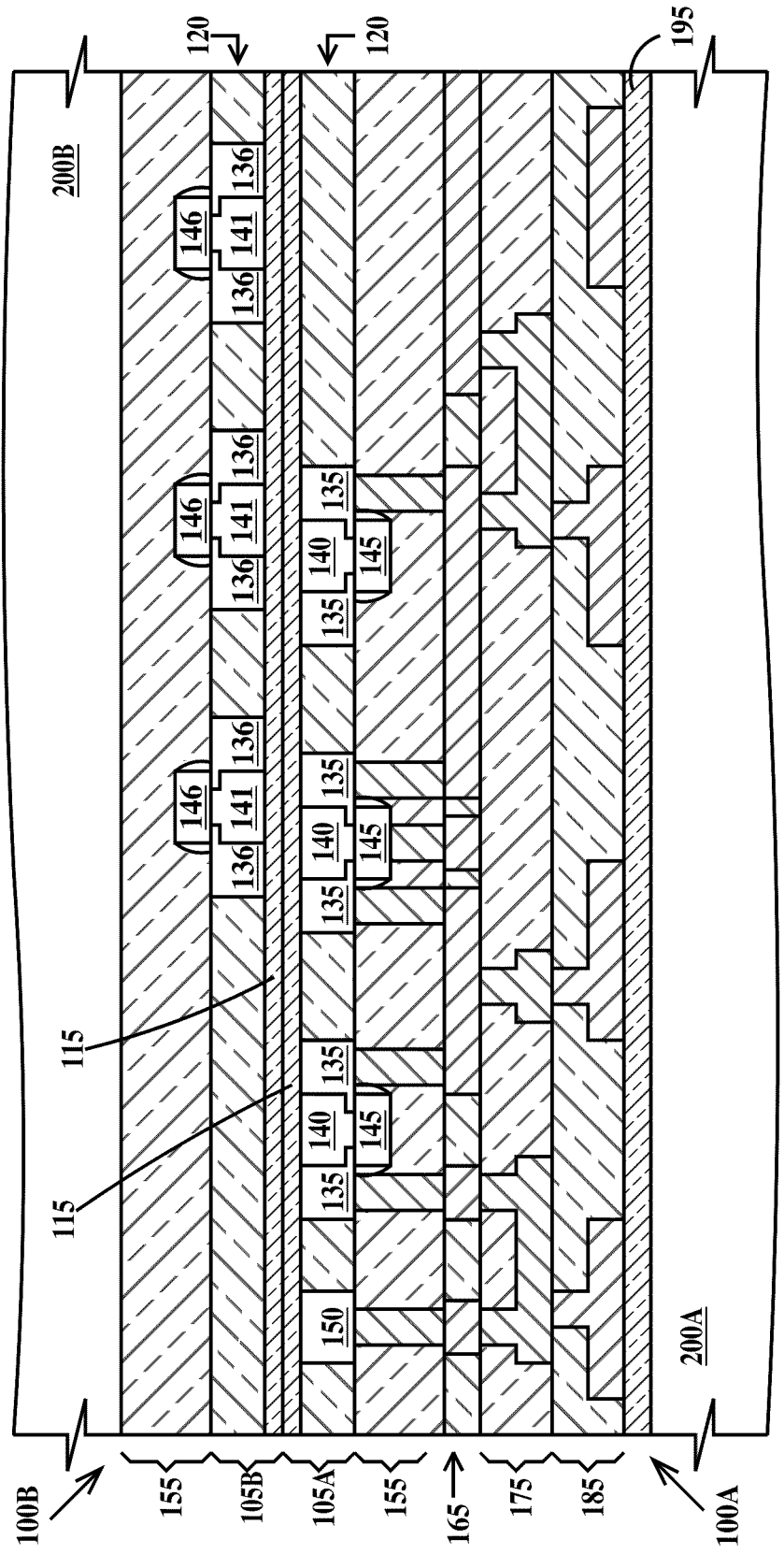

In FIG. 1G, BOX 115 of first wafer 110A is placed over BOX 115 of second wafer 110B and the first and second wafers are aligned to each other so that when interconnections between devices on wafer 100A and devices on wafers 110B are fabricated as described infra, the interconnections and devices will all be in alignment. After alignment, BOX 115 of first wafer 100A is bonded to BOX 115 of second wafer 110B by methods known in the art. To achieve good alignment between wafers, e.g. 0.1-10 micron overlay registration, alignment marks would need to be included on both wafers designed such that the wafers could be aligned as known in the art.

Figure 1H:
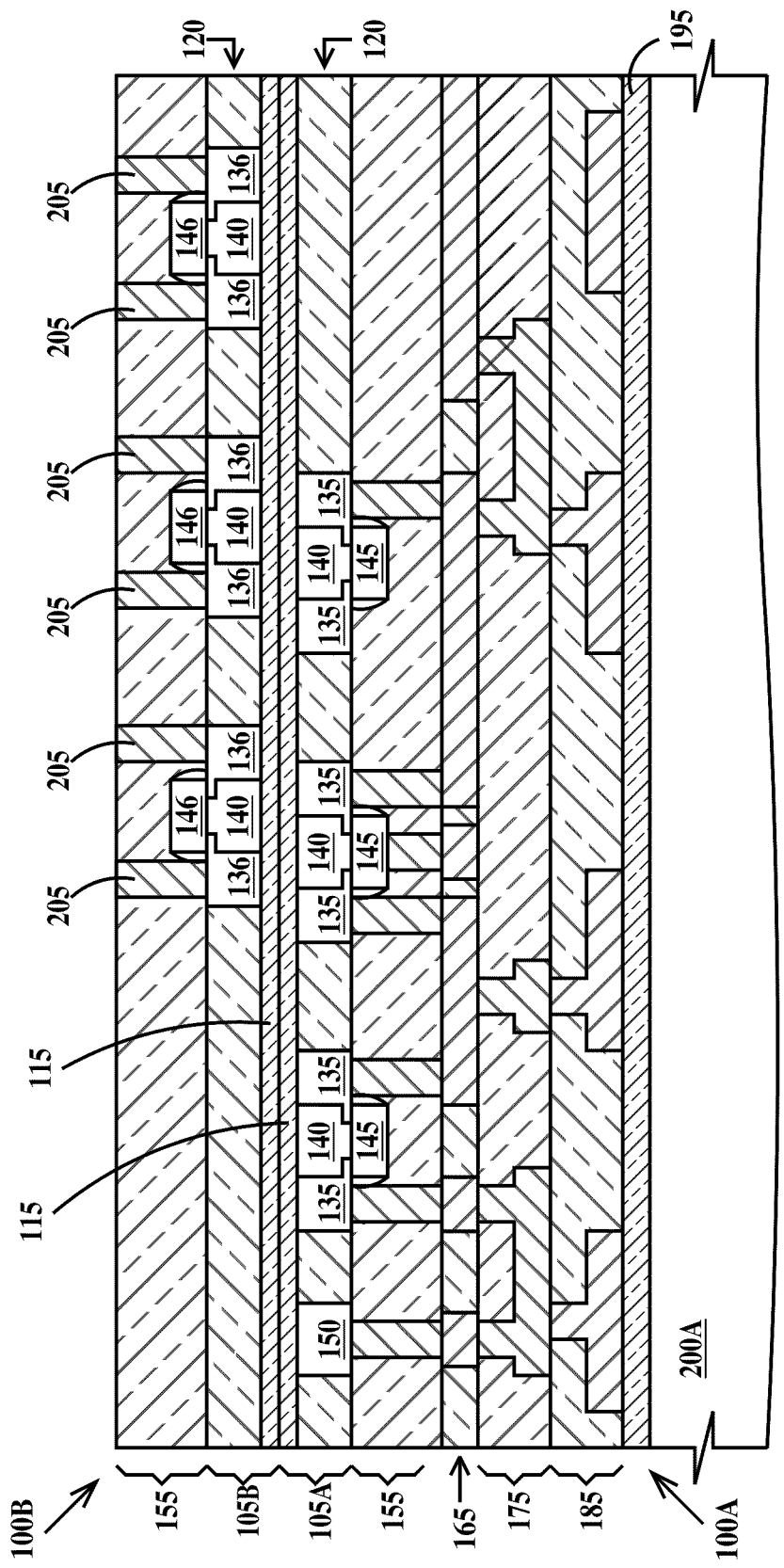

In FIG. 1H, handle wafer 200B (see FIG. 1G) is removed as known in the art and electrically conductive first type contacts 205 are formed in PMD layer 155 of second wafer 100B. Contacts 205 extend from the top surface of PMD layer 155 to the silicide (if present) of source/drains 135 and gates 146 (not shown). In one example, contacts 205 are formed by a single damascene process. In one example, contacts 205 comprise a tantalum/tantalum nitride liner and a tungsten core.

Figure 1I:
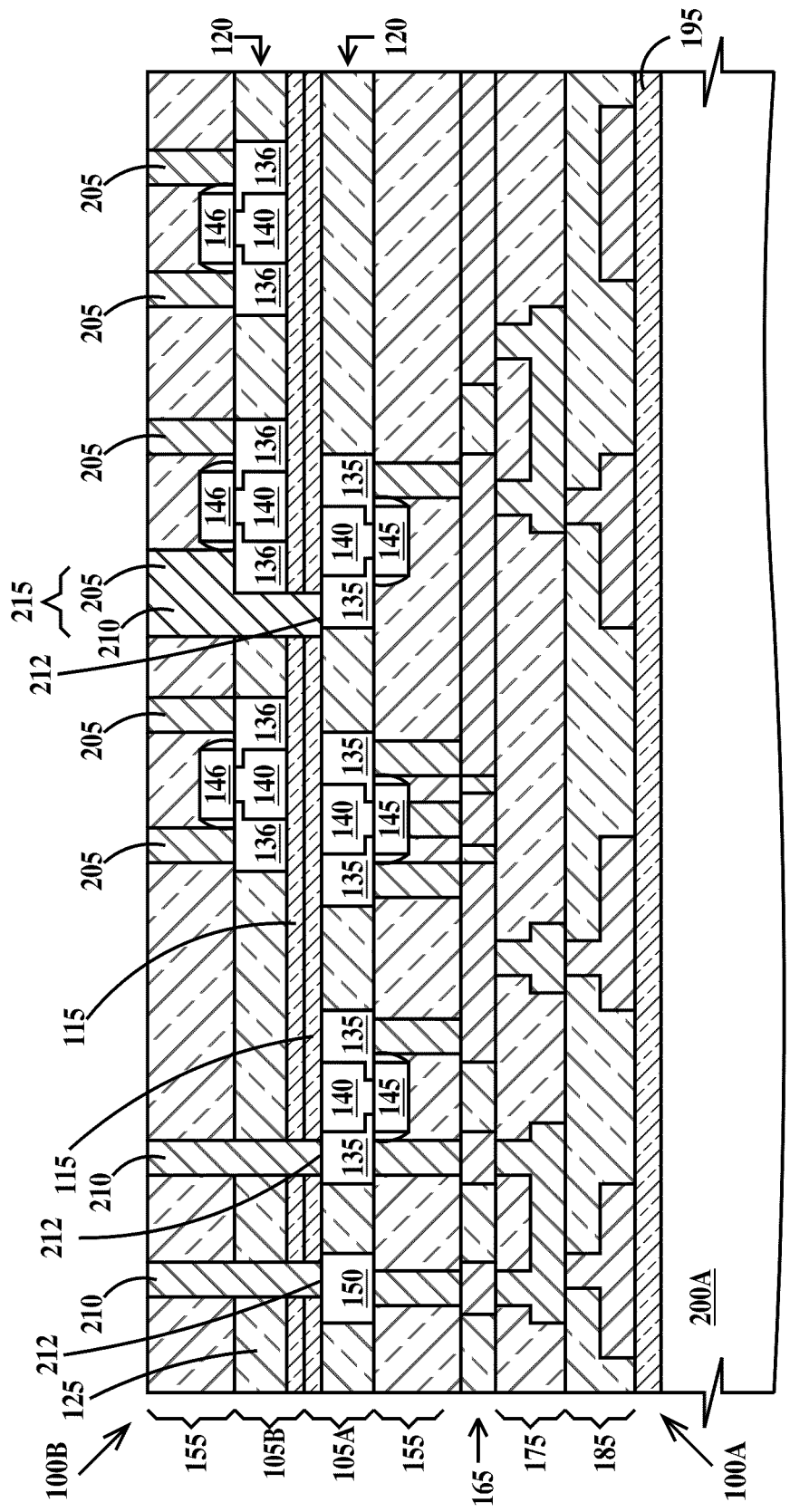

In FIG. 1I, electrically conductive second type contacts 210 are formed through PMD layer 155 of second wafer 110B, trench isolation 125 of second wafer 110B, BOX of 115 of second wafer 110B and BOX 115 of first wafer 110A to source/drains 135 and silicon regions 150 in trench isolation 125 of first wafer 100A. Contacts 210 may also be formed to channel regions 140. An optional backside metal silicide layer 212 may be formed on the exposed surfaces of silicon layer 120 (i.e. source/drains 135, channel regions 140 and silicon regions 150) to further reduce the resistance of the interconnection. However, the temperature of wafers 100A and 100B during the heating step of silicide formation is advantageously held to about 400° C. or less. In one example metal silicide layer 212 comprises nickel silicide. In one example, contacts 205 comprise a tantalum/tantalum nitride liner and a tungsten core.

Further, in FIG. 1I, a third type contact 215 has been formed when a contact 210 is formed abutting (physically and electrically) a contact 205. This allows a silicon region of silicon layer 120 of second wafer 110B to be connected to a silicon region of silicon layer 120 of first wafer in a most direct manner and with the shortest physical path possible.

Note that the first, second, and third (205, 210, and 215) types of contacts could be metallized using damascene methods either separately or at the same time. First and second type contacts 205 and 210 may be fabricated independently in separate operations or simultaneously. When fabricated simultaneously, first and second type contacts may be formed by etching the respective trenches in situ using a single mask or fabricated using various combinations of photolithographic and hard masks and etches to define the trenches separately, followed by a single metal fill and CMP operation.

Figure 1J:
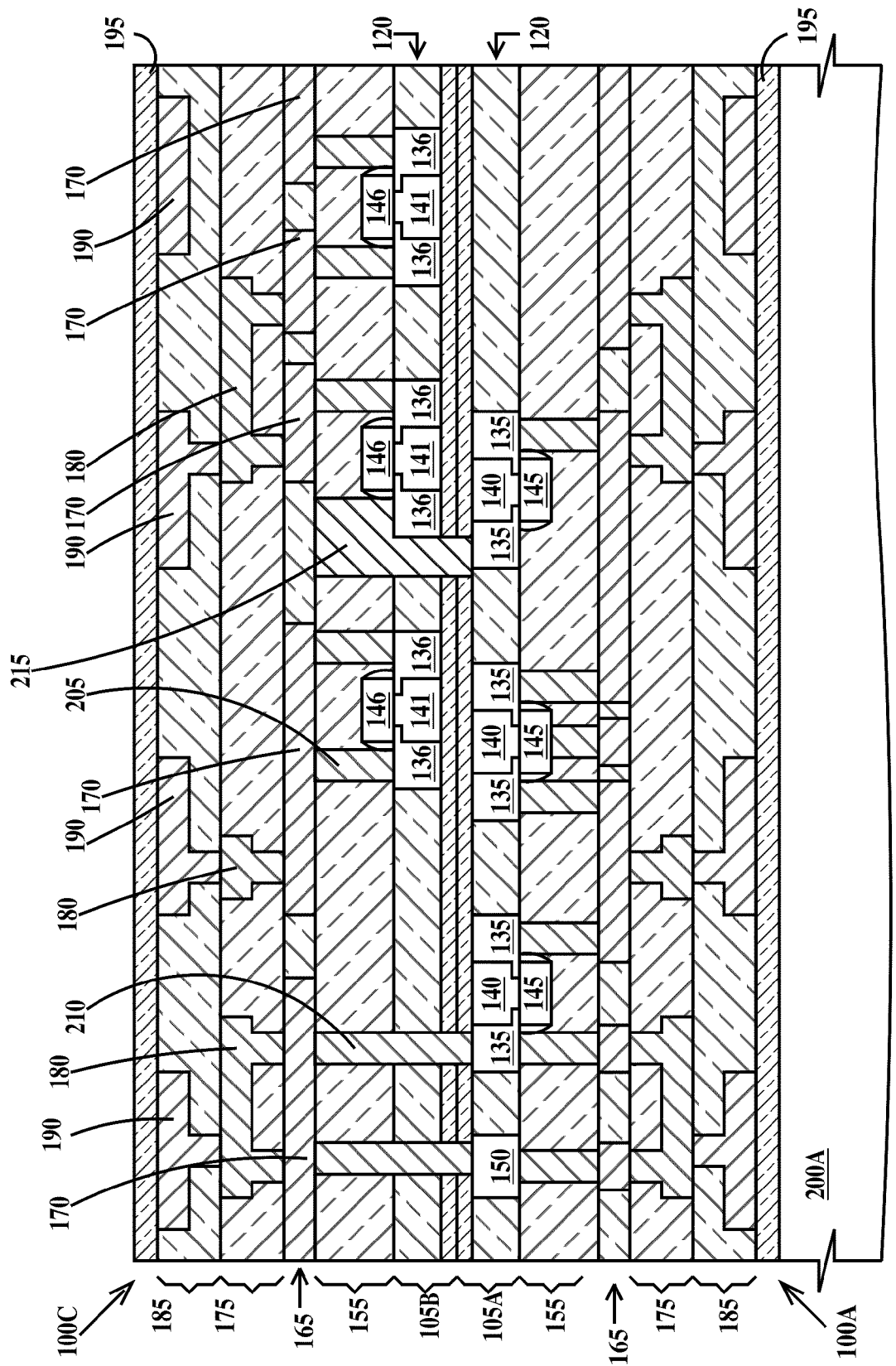

In FIG. 1J, formed on PMD layer 155 of second wafer 100A is first ILD 165 including electrically conductive first wiring level damascene wires 170 in electrical contact with contacts 160. Formed on first ILD 165 is second ILD 180 including electrically conductive dual-damascene wires 180 in electrical contact with wires 170. Formed on second ILD 175 is third ILD 185 including electrically conductive dual-damascene I/O pads 190 in electrical contact with wires 180. A passivation layer 195 is formed on third ILD 185 and I/O pads 190. Alternatively, wires 170, 180 and pads 190 of may be single damascene wires in combination with single damascene vias. This completes fabrication of a double wafer 100C.

While each of wafers 100A and 110B has been illustrated with a single contact levels, two wiring levels and a pad level, more or less contact and wiring levels may be fabricated and wafers 100A and 110B may be fabricated with different numbers of contact and/or wiring levels. Handle wafer 200A may be detached from double wafer 100C at this point in the fabrication process, after further fabrication steps, or after dicing of double wafer 100C into individual integrated circuits.

Figure 2:
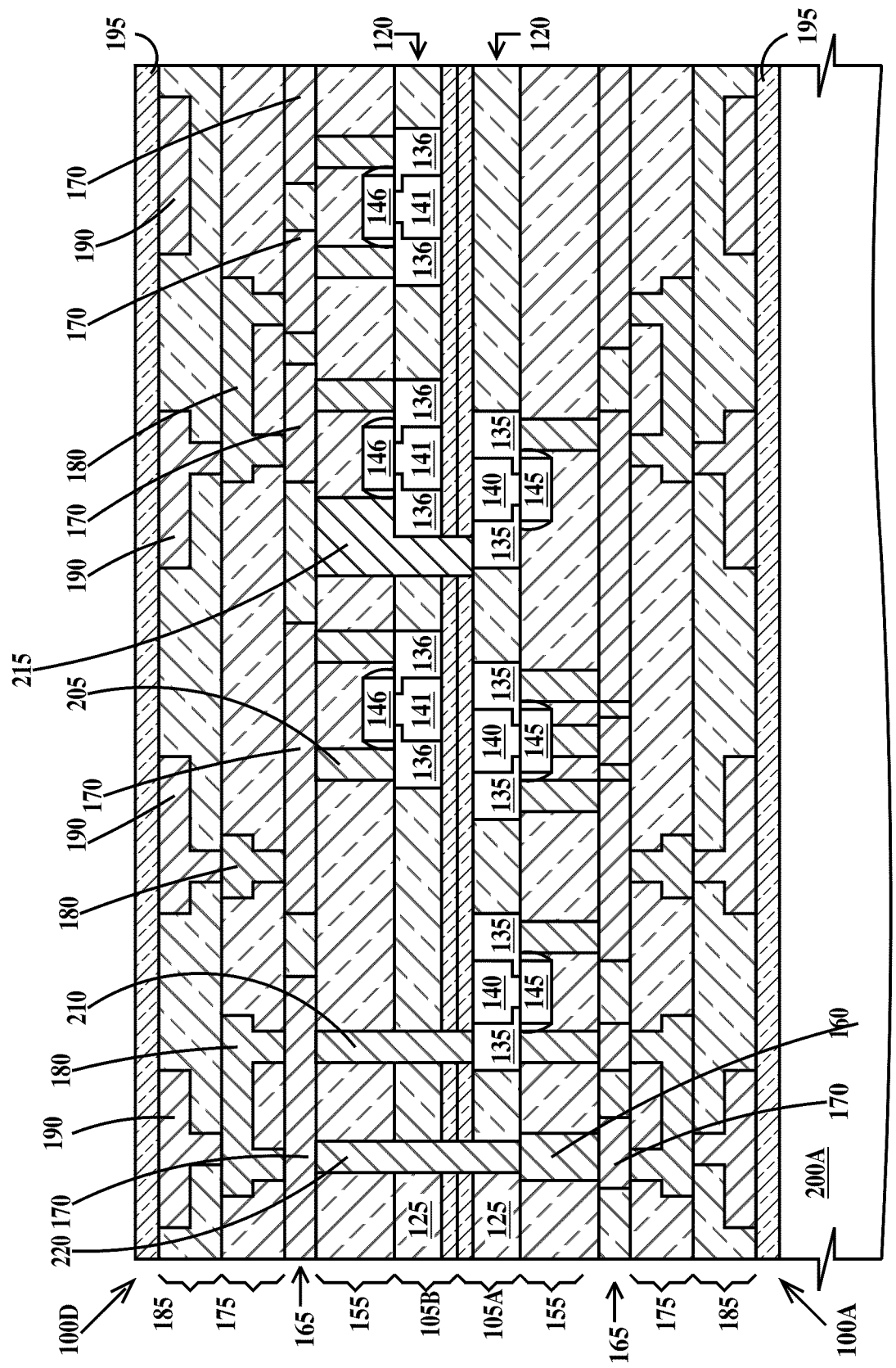
FIG. 2 is a cross-sectional drawing illustrating a first modification to the first embodiment of the present invention.

FIG. 2 is a cross-sectional drawing illustrating a first modification to the first embodiment of the present invention. The first modification to the first embodiment of the present invention adds contacts between structures in first wafer 100A and first level wires 170 first ILD 165. FIG. 2 is similar to FIG. 1J, except that a fourth type contact 220 has been fabricated. Contact 220 extends through PMD layer 155 of second wafer 110B, trench isolation 125 of second wafer 110B, BOX of 115 of second wafer 110B, and BOX 115 of first wafer 110A and trench isolation 125 of first wafer 100A. Fourth type contacts 220 allows direct electrical connection between wires 170 of the first wiring level of second wafer 110B and contacts 160 of first wafer 110A. In one example, contacts 220 are formed by a single damascene process. In one example, contacts 220 comprise a titanium/titanium nitride liner and a tungsten core. Alternatively, fourth type contacts 220 may be formed down to first wires 170 when no contact 160 is provided.

First, second and fourth type contacts 205, 210 and 220 may be fabricated independently in separate operations or simultaneously. When fabricated simultaneously, first, second and fourth type contacts may be formed by etching the respective trenches in situ using a single mask or fabricated using various combinations of photolithographic and hard masks and etches to define the trenches separately, followed by a single metal fill and CMP operation.

Figure 3A:
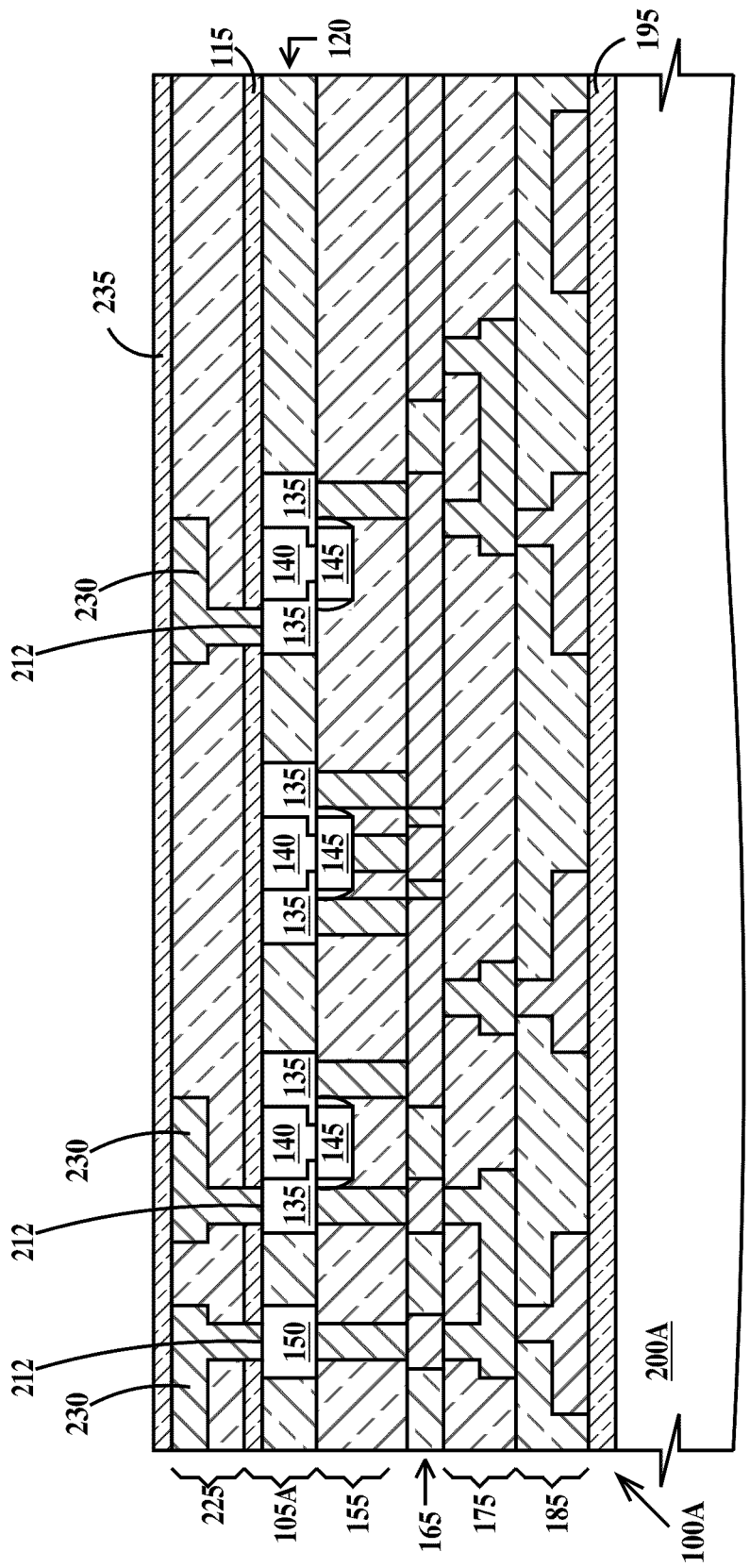
FIGS. 3A through 3C are cross-sectional drawings illustrating a second modification to the first embodiment of the present invention.
Figure 3B:
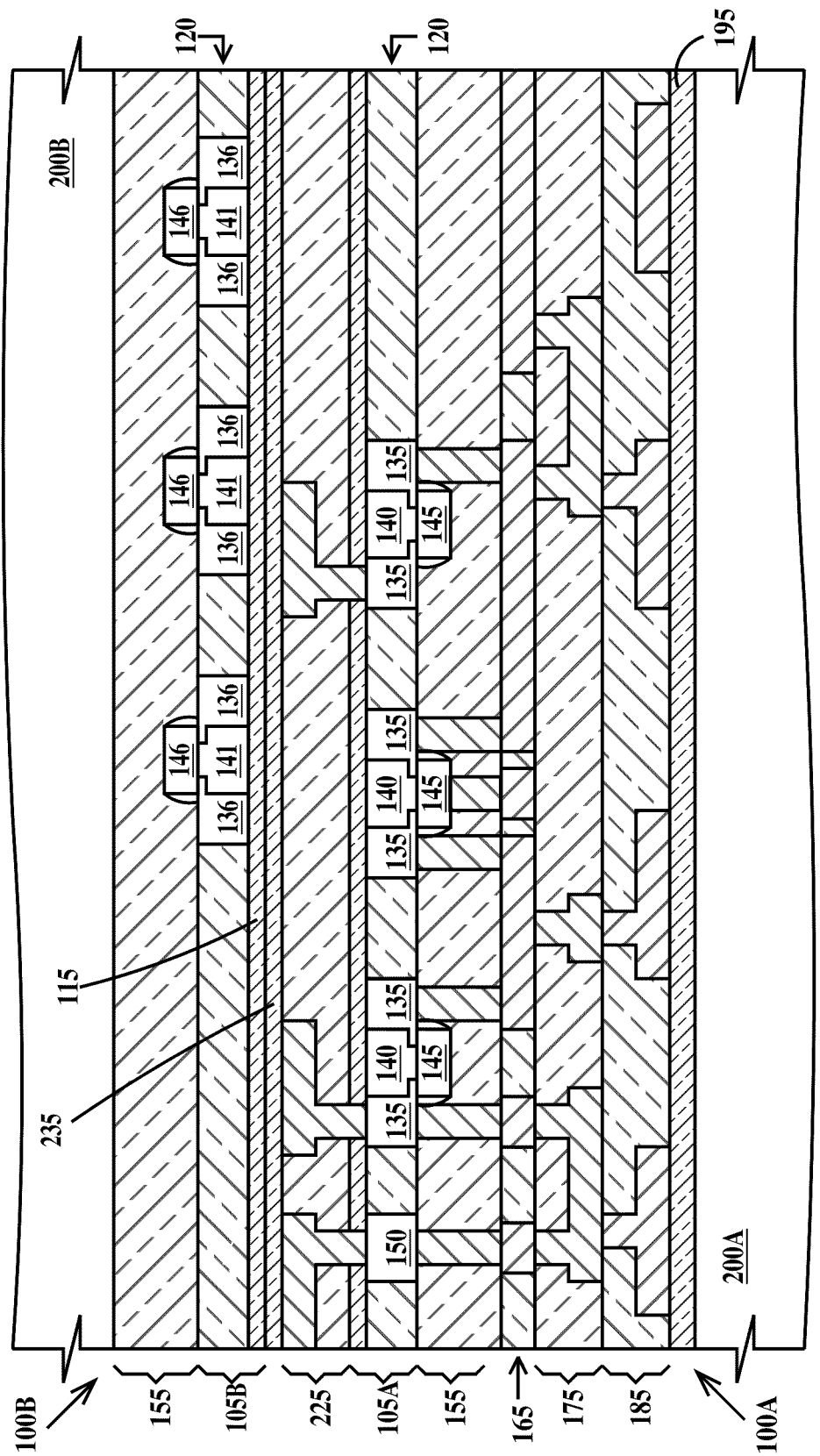
Figure 3C:
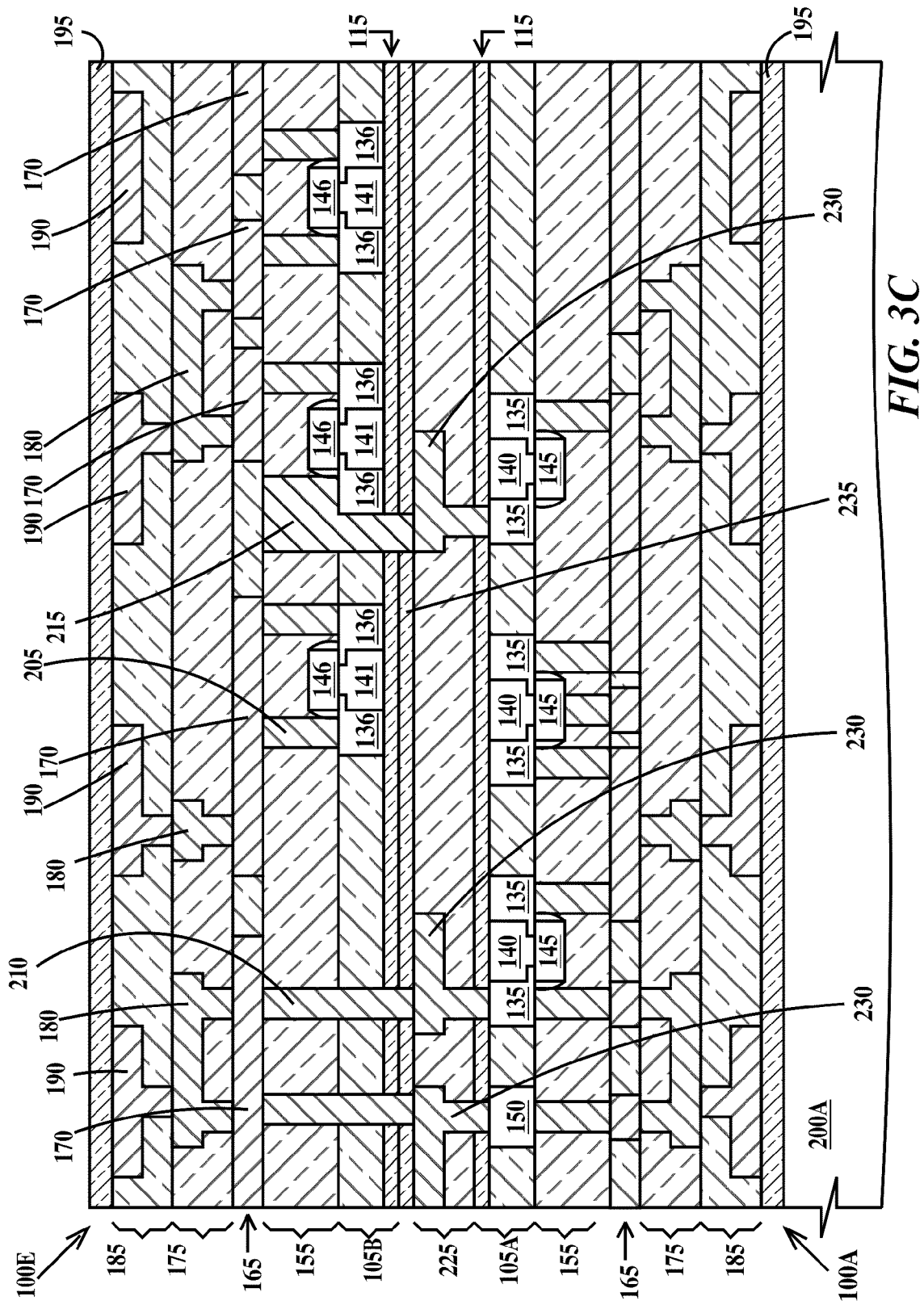

FIGS. 3A through 3C are cross-sectional drawings illustrating a second modification to the first embodiment of the present invention. The second modification to the first embodiment of the present invention adds landing pads above BOX layer 115 of first wafer 100A to reduce the critically of the alignment of wafers 100A and 100B to each other. FIG. 3A is similar to FIG. 1C except that an inter-wafer dielectric layer 225 is formed over BOX 115 and dual-damascene landing pads 230 are formed in dielectric layer 225. Landing pads 230 extend from a top surface of dielectric layer 225, through dielectric layer 225 and BOX 115 to source/drain 135 and silicon regions 150. Landing pads 230 may also contact channel regions 140. A silicon oxide layer 235 is deposited on top of dielectric layer 225 and landing pads 230. Again, optional backside metal silicide layer 212 may be formed on the exposed surfaces of silicon layer 120 (i.e. source/drains 135, channel regions 140 and silicon regions 150) to further reduce the resistance of the interconnection.

FIG. 3B is similar to FIG. 1G except silicon oxide layer 235 of first wafer 100A is bonded to BOX 115 of second wafer 110B instead of BOX-to-BOX bonding. Fabrication continues in a manner similar to that described supra in reference to FIGS. 1H to 1J except that in FIG. 3C, the resulting double wafer 100E includes dielectric layers 225 and 235 and landing pads 230 and contacts 205 and 210 are in direct physical and electrical contact with landing pads 230 rather than in direct physical contact with source/drains 135, channel regions 140 and silicon regions 150. Landing pads 230 can be fabricated from refractory metals (Ti/TiN/W) or copper (Ta/TaN/Cu) as described.

FIGS. 4A through 4E are cross-sectional drawings illustrating fabrication of an integrated circuit chip according to a second embodiment of the present invention. The second embodiment of the present invention is similar to the first embodiment of the present invention except that the first wafer does not include any wiring levels (i.e. does not include first ILD 165, second ILD 175 and corresponding wires 270 and 180 and pads 190. Therefore, in FIG. 4A, a wafer 100F includes SOI substrate 105A which includes a silicon bulk substrate 110A, BOX 115, single-crystal silicon layer 120, trench isolation 125, source/drains 135 and channel regions 140 of FETs 130A, optional silicon regions 150 gate dielectric (not shown) and gates 145 of FETs 130A. While not illustrated in FIG. 4A, wafer 100F may include electrically conductive contacts interconnecting source/drains 145, gates 145 and silicon regions 150. A passivation layer 240 is formed over PMD 155. In one example, passivation layer 240 comprises silicon nitride.

Figure 4C:
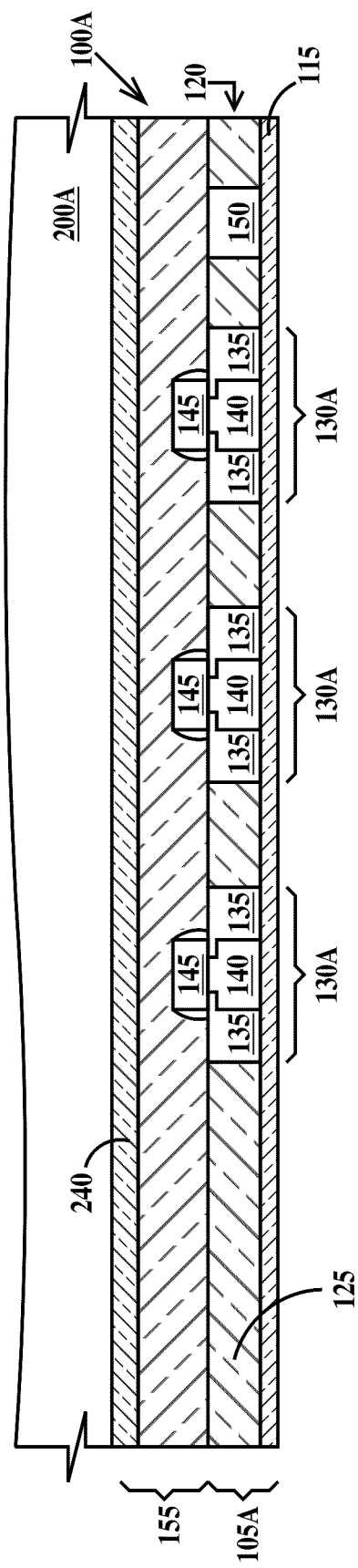
Figure 4D:
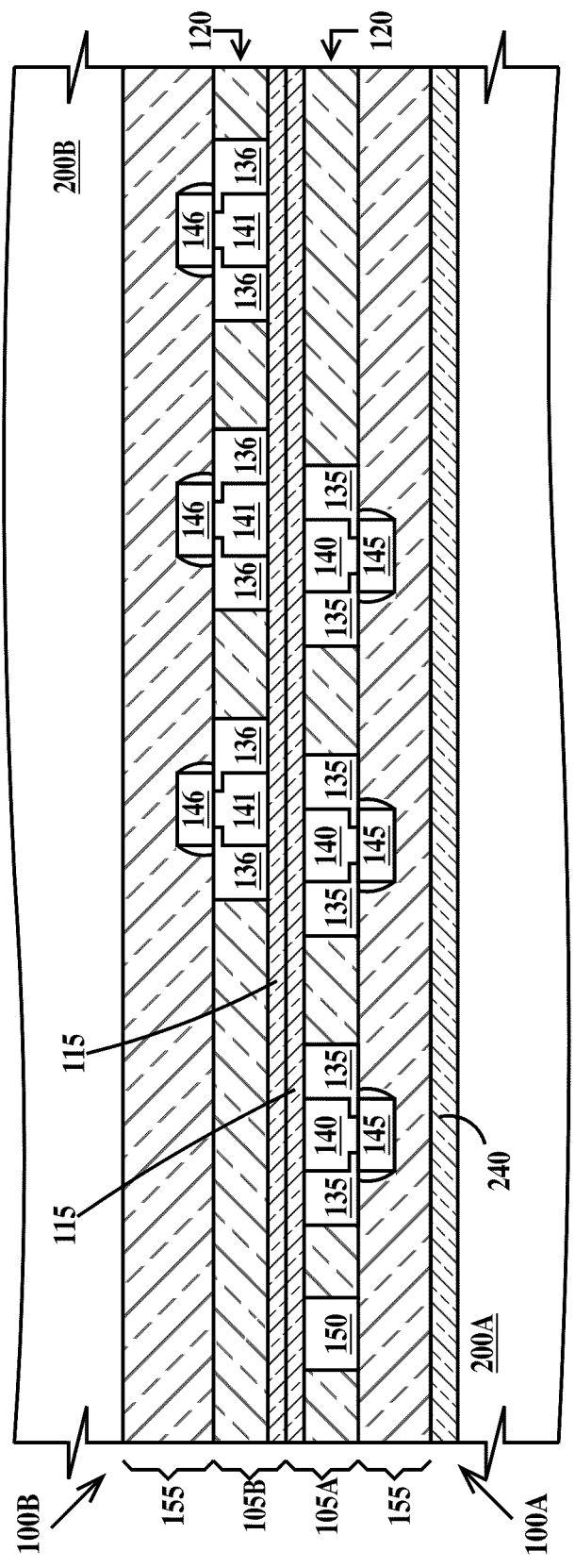
Figure 4E:
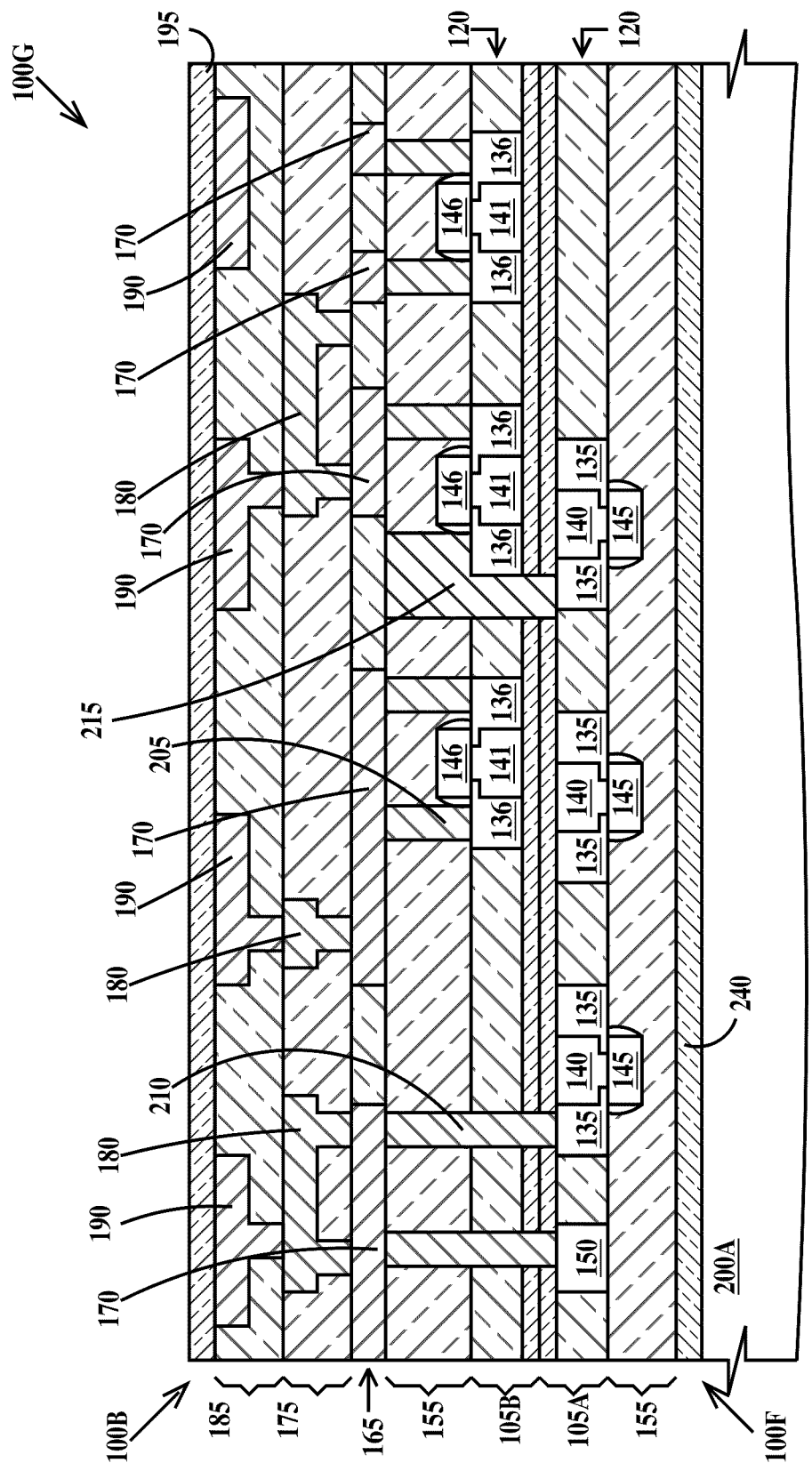

In FIG. 4B, handle wafer 200A is attached to passivation layer 240 and in FIG. 4C, bulk silicon substrate 110A (see FIG. 4B) is removed as described supra to expose BOX 115. In FIG. 4D, second wafer 100B (described supra) is attached to first wafer 110F bonding BOX 115 of first wafer 100F to BOX 115 of wafer 100B. Fabrication continues in a manner similar to that described supra in reference to FIGS. 1H to 1J resulting in double wafer 100G of FIG. 4E.

Figure 5:
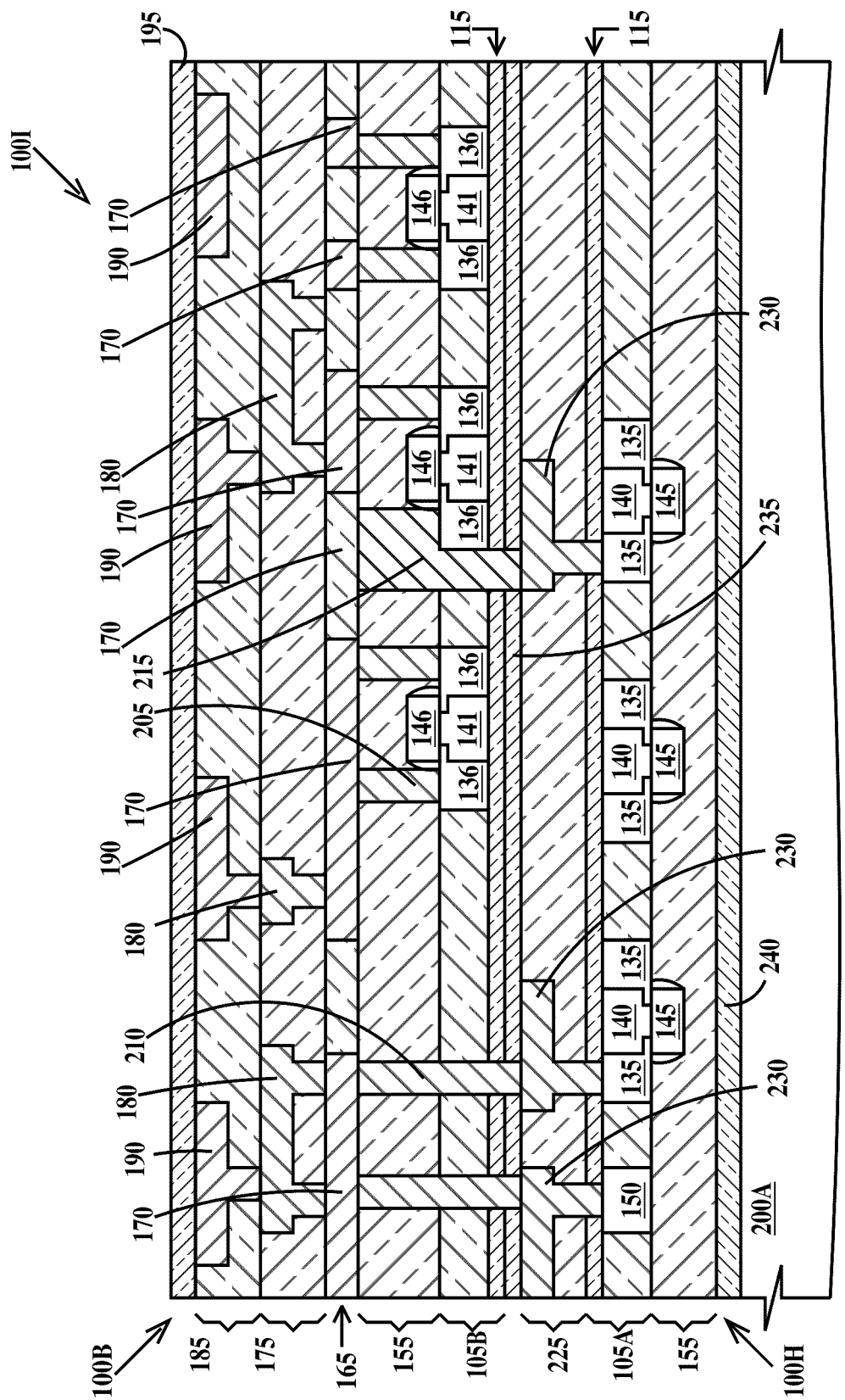
FIG. 5 a cross-sectional drawing illustrating a modification to the second embodiment of the present invention.

FIG. 5 a cross-sectional drawing illustrating a modification to the second embodiment of the present invention. The modification to the second embodiment of the present invention is similar to the second modification to the first embodiment in that landing pads are added above BOX layer 115 of a first wafer 100H (otherwise identical to wafer 100F of FIG. 4E) to reduce the critically of the alignment of wafers 100F and 100B to each other. FIG. 5 is similar to FIG. 4E except that a dielectric layer 225 is formed over BOX 115 and dual-damascene landing pads 230 are formed in dielectric layer 225. Landing pads 230 extend from a top surface of dielectric layer 225, through dielectric layer 225 and BOX 115 to source/drain 135 and silicon regions 150. Landing pads 230 may also contact channel regions 140. A silicon oxide layer 235 is deposited on top of dielectric layer 225 and landing pads 230. Wafers 100H is bonded to wafer 110B by bonding BOX 115 of wafer 100B to silicon oxide layer 235 of wafer 100H.

Figure 6A:
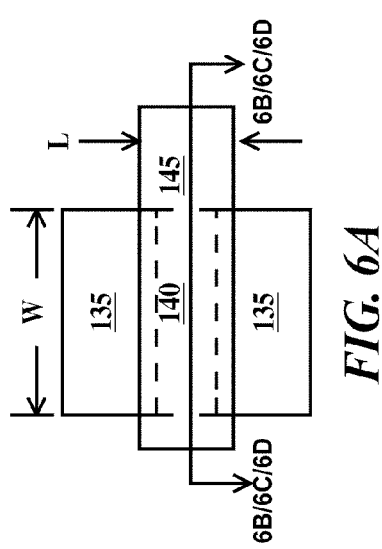
FIG. 6A is an orientation view and FIGS. 6B through 6D are cross-section views illustrating alternative methods of contacting the gates of devices according to the various embodiments of the present invention.
Figure 6C:
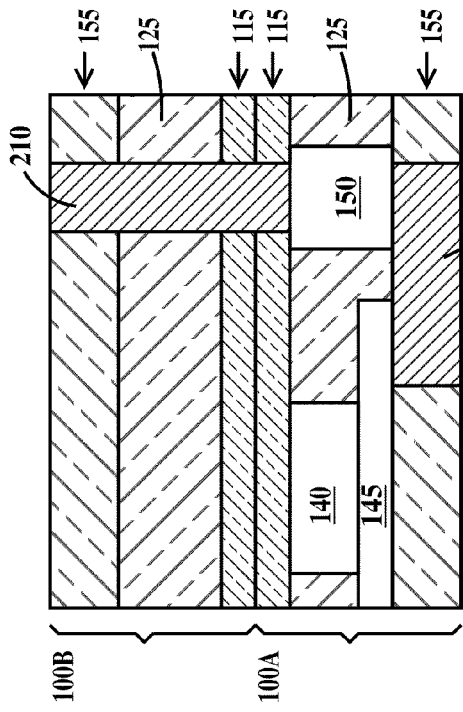
Figure 6D:
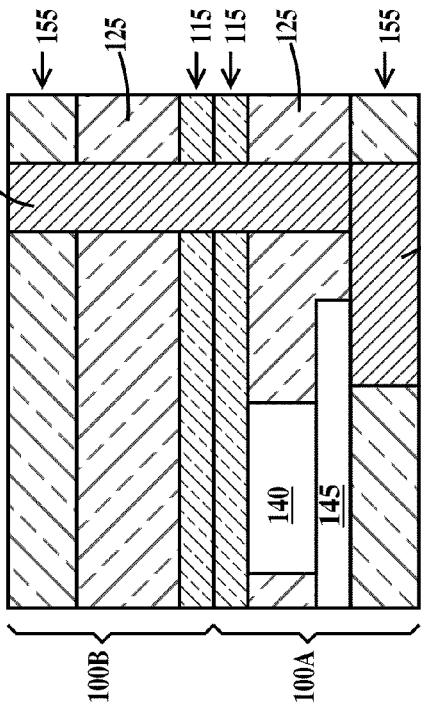
Figure 6B:
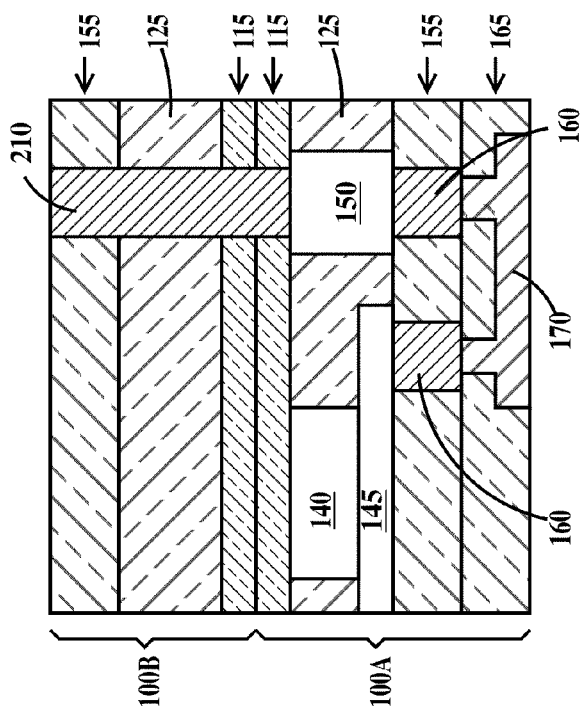

FIG. 6A is an orientation view and FIGS. 6B through 6D are cross-section views illustrating alternative methods of contacting the gates of devices according to the various embodiments of the present invention. In FIG. 6A, gate 145 overlaps source/drains 135 in both the length and width directions. Channel region 140 has a channel length dimension of L and a channel width dimension of W. Source drains 135 and channel region 140 are surrounded by trench isolation (not shown).

In FIG. 6B, electrical connection to gate 145 in first wafer 100A from second wafer 100B is through contact 210, silicon region 150, a first contact 160, wire 170 and a second contact 160. In FIG. 6C, electrical connection to gate 145 in first wafer 100A from second wafer 100B is through contact 210, silicon region 150, and an elongated contact 160. In FIG. 6D, electrical connection to gate 145 in first wafer 100A from second wafer 100B is through contact 220 and an elongated contact 160.

The use of two wafers (for example 110A and 100B) allows devices (for example FETs) to be fabricated differently in each wafer in order to optimize certain device parameters, types, structures and fabrication processes in one wafer differently and without adversely effecting parameters, types, structures and fabrication processes in the second wafer. For example, the thermal budget (total time wafer is at a temperature greater than about 400° C. during fabrication) of the first wafer may be less than that of the second wafer. Examples, of fabrication and device combination possible include, but are not limited to those described in Table I.

TABLE I

| OPTION | FIRST WAFER | SECOND WAFER |
| --- | --- | --- |
| 1 | NFETs | PFETs |
| 2 | FETs in Tension | FETs in Compression |
| 3 | Logic Circuits | Memory Circuits |
| 4 | High Threshold ($V_T$) FETs | Low Threshold ($V_T$) FETs |
| 5 | Thick Gate Dielectric FETs | Thin Gate Dielectric FETs |
| 6 | Analog Circuits | Digital Circuits |
| 7 | <100> Silicon Wafer | <110> Silicon Wafer |
| 8 | Thermal Budget | Thermal Budget |

TABLE I-continued

| OPTION | FIRST WAFER | SECOND WAFER |
|---|---|---|
| 9 | 1<br>CMOS FETS | 2<br>Bipolar Transistors |

It should be understood that items listed under the first wafer may be swapped with items listed under the second wafer for any option and that the first wafer may include one or more options and the second wafer may include one or more options, the number of options and the options themselves may be the same or different for the two wafers, provided the items selected for a particular wafer are not mutually exclusive. For example, <100> and <110> orientation are mutually exclusive.

FIG. 7 is an isometric view of an optional alignment of two wafers during fabrication of integrated circuit chips according to the embodiments of the present invention. In crystalline solids, the atoms, which make up the solid, are spatially arranged in a periodic fashion called a lattice. A crystal lattice contains a volume, which is representative of the entire lattice and is regularly repeated throughout the crystal. In describing crystalline semiconductor materials in the present disclosure, the following conventions are used.

The directions in a lattice are expressed as a set of three integers with the same relationship as the components of a vector in that direction. For example, in cubic lattices, such as silicon, that has a diamond crystal lattice, a body diagonal exists along the [111] direction with the [ ] brackets denoting a specific direction. Many directions in a crystal lattice are equivalent by a symmetry transformation, depending upon the arbitrary choice of orientation axes. For example, the crystal directions in the cubic lattice [100], [010] and [001] are all crystallographically equivalent. A direction and all its equivalent directions are denoted by < > brackets. Thus, the designation of the <100> direction includes the equivalent [100], [010] and [001] positive directions as well as the equivalent negative directions [−100], [0-10] and [00-1].

Planes in a crystal may also be identified with a set of three integers. They are used to define a set of parallel planes and each set of integers enclosed in ( ) parentheses identifies a specific plane. For example the proper designation for a plane perpendicular to the [100] direction is (100). Thus, if either a direction or a plane of a cubic lattice is known, its perpendicular counterpart may be quickly determined without calculation. Many planes in a crystal lattice are equivalent by a symmetry transformation, depending upon the arbitrary choice of orientation axes. For example, the (100), (010) and (001) planes are all crystallographically equivalent. A plane and all its equivalent planes are denoted by { } parentheses. Thus, the designation of the {100} plane includes the equivalent (100), (010) and (001) positive planes as well as the equivalent planes (−100), (0-10) and (00-1).

The mobility of the electrons (inversion carriers) in the channels of N-channel FETs (NFETs) is nearly at its highest in the {100} plane and significantly lower in the {110} plane. The electron-mobility in the {110} plane is about half that in the {100} plane. The mobility of holes (inversion carriers) in the channels of P channel FETS (PFETs) is highest in the {110} plane and significantly lower in the {100} plane. The hole-mobility in the {100} plane is about less than half that in the {110} plane.

In FIG. 7, after wafer-to-wafer bonding, wafer 100A is aligned to wafer 100B about a mutual axis CL through the center of each wafer; the [100] direction of wafer 100A is aligned with the [110] direction of wafer 110B. PFETs 130B are formed in wafer 100B so their channel length is along the [110] direction to maximize PFET inversion carrier mobility while NFETs in wafer 100A are formed so their channel length is along the [100] direction to maximize NFET inversion carrier mobility. While aligning the [100] direction of wafer 100A with the [110] direction of wafer 100B is optional, such alignment orientates the PFETs and NFETs in the same direction (the channel length direction) facilitating alignment of devices in the two wafers.

FIG. 8 is a cross-sectional view of optional fabrication steps during fabrication of integrated circuit chips according to the embodiments of the present invention. Two optional fabrication steps are shown in FIG. 8. In a first option, FET 130A of wafer 100A is an NFET (source/drains 135 doped N-type, channel region 140 doped P-type) and FET 130B of wafer 100B is a PFET (source/drains 136 doped P-type, channel region 141 doped N-type). A tensile layer 255A is deposited over FET 130A and a compressive layer 255B is deposited over FET 130B. The respective tensile and compressive stresses induced in the silicon regions of FETs 130A and 130B by respective layers 255A and 255B enhance the performance of FETs 130A and 130B. Suitable materials for layers 255A and 255B include but are not limited to silicon nitride, silicon carbide, hydrogenated silicon carbide, hydrogenated silicon carbon nitride, hydrogenated silicon oxycarbide, hydrogenated silicon oxy-carbon nitride and combinations thereof in a single layer and combinations of layers thereof. In one example the amount of stress applied (either tensile or compressive) is between about 0.5 GPa and 4 GPa. Layers 255A and 255B may also serve as diffusion barrier layers.

In a second option, tensile and compressive stresses are introduced into respective FETs 130A and 130B by respective dielectric layers 2550A and 255B. Suitable dielectrics for imparting tensile or compressive stress to FET's 130A and 130B include silicon nitride, silicon carbide, silicon carbonitride, and the like as known in the art. Tensile dielectrics are formed over NFETs and compressive dielectrics over PFETs as is known in the art.

Metal silicide layers 260A and 260B may also be used to lower barrier heights and reduce the contact resistance to the source/drains of FETs. For FET 130A, suitable silicides and their barrier heights include iridium silicide (0.22 eV), platinum silicide (0.26 eV) and palladium silicide (0.4 eV). For FET 130B, suitable silicides and their barrier heights include hafnium silicide (0.50 eV), titanium silicide (0.60 eV), nickel silicide (0.65 eV) and cobalt silicide (0.65 eV).

Figure 9:
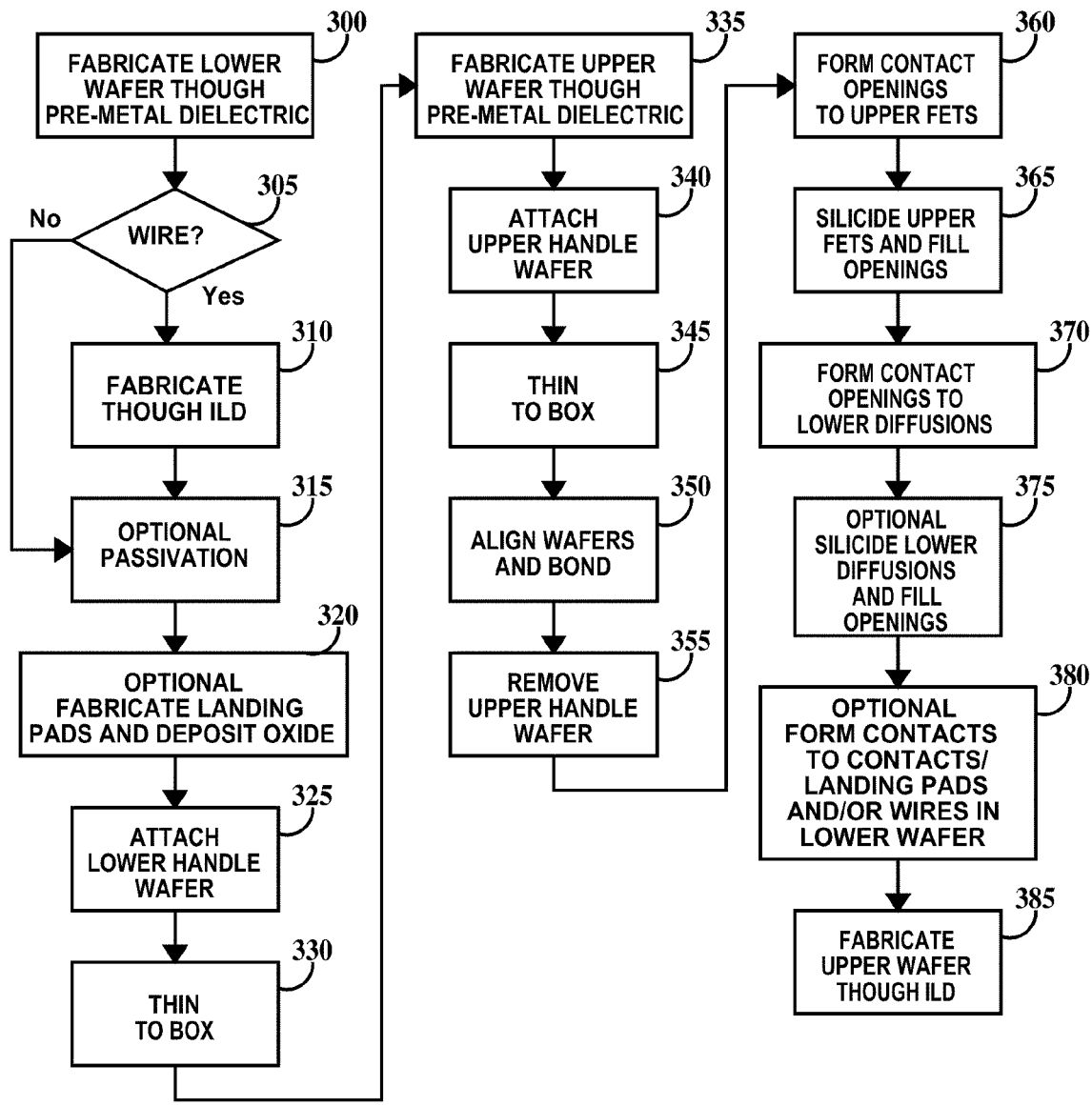
FIG. 9 is a flowchart of the methods of fabricating integrated circuit chips according to the embodiments of the present invention.

FIG. 9 is a flowchart of the methods of fabricating integrated circuit chips according to the embodiments of the present invention. In step 300 an SOI lower wafer (corresponding to wafer 100A described supra) is fabricated through PMD. In step 305 it is determined if the lower wafer is to be wired. If the lower wafer is to be wired, then in step 310, the lower wafer is completed through all the ILD levels otherwise the method proceeds to step 315. In step 315 an optional passivation layer is deposited on the frontside of the lower wafer. In step 320 optional landing pads are formed and a silicon oxide layer deposited. In step 325, a lower handle wafer attached to the frontside of the lower wafer and in step 330 the silicon is removed from the backside of the lower wafer, exposing the BOX of the lower wafer. In step 305, an optional passivation layer is deposited on the BOX. If the optional passivation layer is deposited on the BOX.

In step 335, an SOI upper wafer (corresponding to wafer 100B described supra) is fabricated through PMD. In step 340, an upper lower handle wafer attached to the frontside of the upper wafer and in step 345 the silicon is removed from the backside of the upper wafer, exposing the BOX of the upper wafer. In step 350, the lower wafer is inverted and the BOX of the upper wafer is placed on the BOX (or the silicon oxide layer if landing pads are utilized) of the lower wafer, the wafers are aligned and then bonded together. In step 355, the upper handle wafer is removed.

In step 360, contact openings are formed in the PMD of the upper wafer to the devices and FETs (source/drains gates) of the upper wafer. In step 365, a metal silicide is optionally formed and the contact openings filled with an electrically conductive material. In step 370, contact openings are formed through the PMD of the upper wafer and all intervening layers to source/drains of the devices and FETs and other silicon regions of the lower wafer. In step 375, a metal silicide is optionally formed and the contact openings filled with an electrically conductive material. In step 380, contact openings are formed through the PMD of the upper wafer and all intervening layers to the landing pads and/or contracts and/or first level wires of the lower wafer and the openings filled with an electrically conductive material. In step 385, the upper wafer is fabricated though all ILD levels.

Thus, the embodiments of the present invention provide integrated circuit chips and methods of fabricating integrated circuit chips wherein the fabrication process may be adjusted to enhance the performance of different types of devices in a cost effective manner.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor structure, comprising:
one or more first devices of a first substrate, said first substrate comprising a first oxide layer, a first silicon layer on said first oxide layer and a first lowermost dielectric layer on said first silicon layer;
one or more second devices of a second substrate, said second substrate comprising a second oxide layer, a second silicon layer on said second oxide layer and a second lowermost dielectric layer on said second silicon layer;
a top surface of said first oxide layer in direct physical contact with and bonded to a top surface of said second oxide layer;
electrically conductive first contacts to said second devices, said first contacts extending from a top surface of said second lowermost dielectric layer through said second lowermost dielectric layer to said first devices;
electrically conductive second contacts to said first devices, said second contacts extending from said top surface of said second lowermost dielectric layer through said second lowermost dielectric layer, through said first and second oxide layers to those portions of said second devices formed in said second silicon layer; and
one or more second wiring levels over said second lowermost dielectric layer, each wiring level of said second wiring levels comprising electrically conductive wires in a corresponding dielectric layer, one or more wires of a lowermost wiring level of said second wiring levels in physical and electrical contact with said first and second contacts.

2. The structure of claim 1, further including:
one or more first wiring levels over said first silicon layer and interconnecting said first devices, each wiring level of said first wiring levels comprising electrically conductive wires in a corresponding dielectric layer, said one or more first wiring levels including electrically conductive wires formed in said first lowermost dielectric layer.

3. The structure of claim 2, further including:
electrically conductive third contacts, said third contacts extending from said top surface of said second lowermost dielectric layer through said second lowermost dielectric layer, through said first and second oxide layers and through said first silicon layer to one or more wires of said wires in said first lowermost dielectric layer, said third contacts electrically isolated from said first silicon layer.

4. The structure of claim 1, further including:
a handle substrate attached to an uppermost dielectric layer of said first substrate furthest away from said first silicon layer.

5. The structure of claim 1, wherein said first devices are N-channel field effect transistors and said second devices are P-channel field effect transistors.

6. The structure of claim 1, wherein said first silicon layer is a single crystal silicon layer having a <100> crystal orientation, said first devices are N-channel field effect transistors and the channel length of said N-channel field effect transistors is along the [100] crystal direction of said first upper silicon layer and wherein said second silicon layer is a single crystal silicon layer having a <110> crystal orientation, said second devices are P-channel field effect transistors and the channel length of said P-channel field effect transistors is along the [110] crystal direction of said second upper silicon layer.

7. The structure of claim 1, wherein said first devices are N-channel field effect transistors, sources and drains thereof are in tension and said second devices are P-channel field effect transistors sources and drains thereof are in compression.

8. The structure of claim 1, wherein said first and second devices are field effect transistors, said first devices having a higher threshold voltage than said second devices.

9. The structure of claim 1, wherein (i) said first devices are field effect transistors and source/drains of said first devices abut a bottom surface of said first oxide layer and gates of said first devices are formed in said first lowermost dielectric layer and (ii) said second devices are field effect transistors and source/drains of said second devices abut a bottom surface of said second oxide layer and gates of said second devices are formed in said second lowermost dielectric layer.

10. The structure of claim 1, wherein said first and second devices are field effect transistors, said first devices having a thicker gate dielectric than said second devices.

11. The structure of claim 1, wherein said first devices comprise only logic circuits and said second devices comprise memory circuits.

12. The structure of claim 1, wherein said first devices are field effect transistors and said second devices are bipolar transistors.

13. A semiconductor structure, comprising:
one or more first devices of a first substrate, said first substrate comprising a first oxide layer, a first silicon layer on said first oxide layer and a first lowermost dielectric layer on said first silicon layer;

one or more second devices of a second substrate, said second substrate comprising a second oxide layer, a second silicon layer on said second oxide layer and a second lowermost dielectric layer on said second silicon layer;

an inter-substrate dielectric layer in direct physical contact with a top surface of said first oxide layer;

electrically conductive landing pads in said inter-substrate dielectric layer, said landing pads extending from a top surface of said inter-substrate dielectric layer, through said first oxide layer to those portions of said first devices formed in said first silicon layer;

a silicon oxide bonding layer in direct physical contact with a top surface of said inter-substrate dielectric layer, a top surface of said bonding layer in direct physical contact with and bonded to a top surface of said second oxide layer;

electrically conductive first contacts extending from a top surface of said second lowermost dielectric layer through said second lowermost dielectric layer to said first devices;

electrically conductive second contacts extending from said top surface of said second lowermost dielectric layer through said second lowermost dielectric layer, through said second oxide layer, through said bonding layer to said landing pads; and one or more second wiring levels over said second lowermost dielectric layer, each wiring level of said second wiring levels comprising electrically conductive wires in a corresponding dielectric layer, one or more wires of a lowermost wiring level of said second wiring levels in physical and electrical contact with said first and second contacts.

14. The structure of claim 13, further including:
one or more first wiring levels formed over said first silicon layer interconnecting said first devices, each wiring level of said first wiring levels comprising electrically conductive wires in a corresponding dielectric layer, said one or more first wiring levels including electrically conductive wires formed in said first lowermost dielectric layer.

15. The structure of claim 13, further including:
a handle substrate attached to an uppermost dielectric layer of said first substrate furthest away from said first silicon layer.

16. The structure of claim 13, wherein said first devices are N-channel field effect transistors and said second devices are P-channel field effect transistors.

17. The structure of claim 13, wherein said first silicon layer is a single crystal silicon layer having a <100> crystal orientation, said first devices are N-channel field effect transistors and the channel length of said N-channel field effect transistors is along the [100] crystal direction of said first upper silicon layer and wherein said second silicon layer is a single crystal silicon layer having a <110> crystal orientation, said second devices are P-channel field effect transistors and the channel length of said P-channel field effect transistors is along the [110] crystal direction of said second upper silicon layer.

18. The structure of claim 13, wherein said first devices are N-channel field effect transistors, sources and drains thereof are in tension and said second devices are P-channel field effect transistors sources and drains thereof are in compression.

19. The structure of claim 13, wherein said first and second devices are field effect transistors, said first devices having a higher threshold voltage than said second devices or wherein said first and second devices are field effect transistors, said first devices having a thicker gate dielectric than said second devices.

20. A semiconductor device, comprising:
one or more first devices of a first substrate, said first substrate comprising a first oxide layer, a first silicon layer on said first oxide layer and a first lowermost dielectric layer on said first silicon layer;

one or more second devices of a second substrate, said second substrate comprising a second buried oxide, a second silicon layer on said second oxide layer and a second lowermost dielectric layer on said second silicon layer;

a top surface of said first oxide layer bonded to a top surface of said second oxide layer;

first electrically conductive contacts extending from a top surface of said second lowermost dielectric layer through said second lowermost dielectric layer through said second lowermost dielectric layer to said first devices; and second electrically conductive contacts to metal silicide layers on those portions of said first devices formed in said first silicon layer, said second electrically conductive contacts extending from a top surface of said first lowermost dielectric layer and said first and second buried dielectric layers to said metal silicide layers.

21. The structure of claim 20, wherein said metal silicide layers comprise nickel silicide.

22. A semiconductor device, comprising:
one or more first devices of a first substrate, said first substrate comprising a first oxide, a first silicon layer on said first oxide layer a first lowermost dielectric layer on said first silicon layer;

one or more second devices of a second substrate, said second substrate comprising a second oxide, a second silicon layer on said second oxide layer and a second lowermost dielectric layer on said second silicon layer;

an inter-substrate dielectric layer on a top surface of said first oxide layer, an electrically conductive landing pad extending from a top surface of said inter-substrate dielectric layer, through said first oxide layer to metal silicide layers on those portions of said first devices formed in said first silicon layer;

a silicon oxide bonding layer on said top surface of said inter-substrate dielectric layer, a top surface of said silicon oxide bonding layer bonded to a top surface of said second oxide layer;

electrically conductive first contacts extending from a top surface of said second lowermost dielectric layer through said second lowermost dielectric layer to said second devices; and electrically conductive second contacts to said landing pads, said second contacts extending from said top surface of said second lowermost dielectric layer through said second oxide layer, through said bonding layer to said landing pads.

23. The structure of claim 22, wherein said metal silicide layer comprises nickel silicide.

* * * * *